US012796444B2

(12) United States Patent

Brun et al.

(10) Patent No.: US 12,796,444 B2
(45) Date of Patent: Nov. 10, 2026

(54) BARRIER FOR MINIMAL UNDERFILL KEEP-OUT ZONES

(71) Applicant: Intel Corporation, Santa Clara, CA (US)

(72) Inventors: Xavier F. Brun, Hillsboro, OR (US); Jonas G. Croissant, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 17/856,810

(22) Filed: Jul. 1, 2022

(65) Prior Publication Data

US 2024/0006312 A1 Jan. 4, 2024

(51) Int. Cl.
*H10W 20/41* (2026.01)

(52) U.S. Cl.
CPC .................................. *H10W 20/435* (2026.01)

(58) Field of Classification Search
CPC ....... H01L 23/5283; H01L 2225/06517; H01L 2225/06548; H01L 2225/06572; H01L 2225/06582; H01L 23/49811; H01L 21/563; H01L 24/81; H01L 25/0652; H01L 23/481; H01L 23/5389; H01L 2224/73204; H01L 2224/81
See application file for complete search history.

(56) References Cited

U.S. PATENT DOCUMENTS 11,158,558 B2 10/2021 Jain et al.
2020/0126887 A1 4/2020 Lin et al.
2022/0359341 A1* 11/2022 Kim ........................ H01L 25/18
2023/0142301 A1* 5/2023 Lee .................. H01L 23/49894 257/690
2023/0420330 A1* 12/2023 Sun ......................... H01L 24/97
2023/0422412 A1* 12/2023 Hayashi ................ H01L 21/486

OTHER PUBLICATIONS

Abdilla, J., et al., "Thermo compression bonding for large dies under protective atmosphere", IEEE 70th Electronic Components and Technology Conference (ECTC), 2020.

* cited by examiner

*Primary Examiner* — Jeff W Natalini
*Assistant Examiner* — Nicholas Leland Hutson
(74) *Attorney, Agent, or Firm* — Essential Patents Group, LLP

(57) ABSTRACT

An integrated circuit (IC) device package substrate comprises a plurality of first interconnect features to couple to a first IC die, a plurality of second interconnect features to couple to a second IC die, and one or more barrier features on a surface of the substrate. The first interconnect features span a first length in a first direction on the surface of the substrate. The second interconnect features span a second length in the first direction on the surface of the substrate. The second interconnect features are between the first length of the first interconnect features and a first edge of the substrate. The one or more barrier features are between the first and second interconnect features, wherein the one or more barrier features span a third length in the first direction, the third length greater than at least one of the first or second lengths.

20 Claims, 17 Drawing Sheets

BARRIER FOR MINIMAL UNDERFILL KEEP-OUT ZONES

BACKGROUND

In electronics manufacturing, integrated circuit (IC) packaging is a stage of the manufacturing process where an IC that has been fabricated on a die or chip is coupled to a supporting case or "package" that can protect the IC from physical damage and support electrical contacts suitable for further connecting to a host component, such as a printed circuit board (PCB).

High performance computing products often now include microelectronic packages that contain various combinations of semiconductor tiles, chips, chiplets, and dies (which may be referred to collectively as "IC dies"), and a substrate that are integrated into one functional unit. These composite, or heterogeneous, IC devices may include multiple IC dies created using diverse technologies and materials. In these microelectronic packages, multiple IC dies can be placed both horizontally in an x-y plane and stacked vertically in the z direction.

There are a variety of manufacturing challenges at the IC packaging stage of electronics manufacturing. Various manufacturing challenges arise when IC dies are placed horizontally or stacked vertically in a 3D package.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
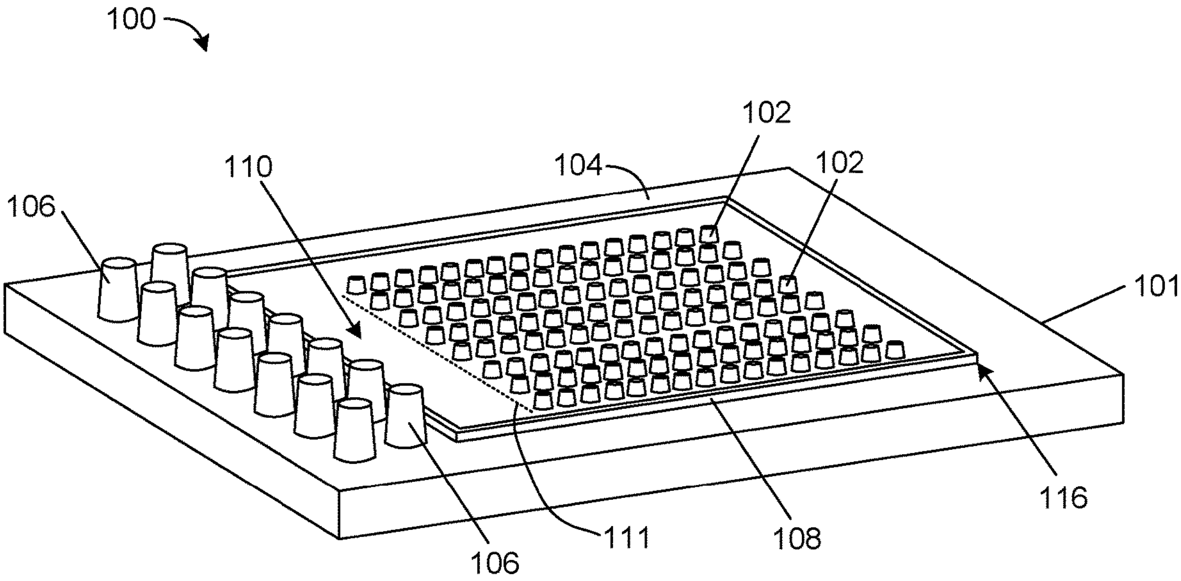
FIG. 1 is a perspective view of an IC device comprising a barrier feature on a surface of a substrate to arrest the flow of underfill material according to an embodiment.

Embodiments relate to a barrier feature on a surface of a substrate or other bottom component in a composite IC device to arrest the flow of underfill material. Embodiments may provide a minimal keep out zone without adding process steps Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or functional changes may be made without departing from the scope of claimed subject matter. It should also be noted that directions and references (e.g., up, down, top, bottom, etc.) may be used merely to facilitate the description of features in the drawings and relationship between the features. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment"

or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with each of the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or structure disposed over or under another may be directly in contact or may have one or more intervening materials. Moreover, one material disposed between two materials may be directly in contact with the two materials or may have one or more intervening materials. In contrast, a first material or structure "on" a second material or structure is in direct contact with that second material/structure. Similar distinctions are to be made in the context of component assemblies where a first component may be "on" or "over" a second component.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In the manufacture of IC device, one or more "device layers" are fabricated during front-end-of-line (FEOL) processing. Device layers include active or passive devices, or devices of both types. In some embodiments, the active devices are field effect transistors (FETs). Active and passive devices in a device layer are examples of "metallization features." In addition, one or more "metallization layers" are fabricated during back-end-of line (BEOL) processing. Active and passive devices of a device layer are interconnected into circuitry with metal structures within one or more metallization layers. A metallization layer may comprise any number of metal structures separated by inter-layer dielectric (ILD) material. The metal structures in a metallization layer are examples of "metallization features."

The IC package examples described herein may be manufactured, in part, with bonding techniques in which metal features embedded within an insulator of one IC die are directly fused to metal features embedded within an insulator of another die. Where both the metal features and the insulators are fused, the resultant composite structure comprises a hybrid bonded interface of both metallurgically interdiffused metals and chemically bonded insulators. Prior to bonding, each IC die may be fabricated in a monolithic process separate from that of the other IC die. As such, an IC die may utilize the same or different semiconductor device fabrication technologies as the IC die to which it is bonded. These bonding techniques may be referred to as "hybrid" or "direct" bonding.

A composite IC device may include one or more IC dies placed on a substrate or other component. To provide a stronger mechanical connection, distribute heat, and keep moisture out, a dielectric material, known as "underfill," may be provided in the spaces between a top IC die and a bottom component. The underfill material may be an organic material, such as an epoxy, and may include fillers, such as a nanofiller material. In some processes, underfill material is added in a manufacturing step after a top IC die is attached to a bottom component. The underfill material may be added by dispensing the underfill in liquid form at the edge of the top IC die where capillary action causes the liquid to flow under the top IC die. The liquid material subsequently cures into a solid.

One challenge when placing chip underfill material is confining it to the space under the top IC die. When underfill is applied, it may flow away from the IC die in addition to under it, or the liquid may flow in under one side the IC die and flow out of another side. In either case, the liquid underfill material can reach areas on the surface of the substrate or bottom IC die where it is not desired. For example, liquid underfill material can be attracted to copper pillars on the surface of the bottom component. For this reason, a keep out zone (KOZ) may be established on the surface of the bottom component between top IC die and other features on the surface. A KOZ is a design rule that defines a zone around an IC die where it is possible that underfill may flow. The KOZ rule prohibits placement of any interconnect features, devices, or the like within the zone. While a KOZ may prevent liquid underfill from flowing into undesired locations, it also increases the size of the surface area required for the substrate or bottom IC die, which is typically not desirable.

Embodiments relate to a barrier structure on a surface of a substrate or other bottom component in a composite IC device. Some embodiments leverage an existing copper layer at a surface of the substrate and modify the layer to include a permanent barrier of tunable dimensions and location to arrest the flow of underfill material. Embodiments may provide a minimal KOZ without adding process steps.

Thermocompression (TC) bonding refers to a process in which both temperature and pressure is applied to attach a top IC die to a bottom component. Various embodiments may be used with either a Thermocompression Non-Conductive Paste (TC-NCP) or a Thermocompression Capillary Underfill (TC-CUF) process.

An advantage of various embodiments is that a KOZ may be smaller than would otherwise be required if the substrate or other bottom component did not employ of a barrier structure according to the principals of this disclosure. An advantage of a smaller KOZ for the bottom component is that it may be made smaller than would otherwise be required if the bottom component did not employ a barrier structure according to various embodiments.

An advantage of various embodiments over approaches that may be used to minimize a KOZ that employ a Thermocompression Non-Conductive Film (TC-NCF) process is that the disclosed embodiments permit singulated die sorting (SDX). The TC-NCF process includes application of a film to a wafer rather than to individual IC dies. TC bonding is performed through the film. The film is singulated at the same time as the IC dies. Because the film is laminated to the wafer before singulation, the TC-NCF process does not permit sorting of singulated IC die, whereas the disclosed embodiments are compatible with SDX.

FIG. 1 is a perspective view of an IC device 100 comprising a barrier feature or structure on a surface of a substrate 101 to arrest the flow of underfill material according to an embodiment. IC device 100 may be a composite IC device in which one or more IC dies may be stacked on substrate 101. The substrate 101 includes multiple "bumps" 102 on a surface 104 at a site where an IC die is to be placed. The die bumps 102 may be any type of electrically conductive interconnect structures that may be used to mechanically attach and/or electrically couple the IC die to the substrate 101. The substrate 101 also includes pillars 106 on surface 104 that may be used to attach a second IC die to the substrate 101. In some embodiments, the pillars 106 comprise copper or another electrically conductive material. A barrier structure 108 on surface 104 is between interconnections 102 and pillars 106. As shown in FIG. 1, the barrier structure 108 may surround interconnections 102. While the barrier structure 108 shown in FIG. 1 has 90-degree corners where sides meet, e.g., corner 116, this is not required. In various embodiments, the barrier structure may have rounded corners. In some embodiments, the barrier structure 108 comprises copper or another electrically conductive material. A region 110 is on a first edge 111 of the site containing bumps 102 that is closest to pillars 106. The barrier structure 108 is separated from bumps 102 by the span of region 110 on the first edge 111. As may be seen in FIG. 1, the barrier structure 108 is spaced closer to the site containing bumps 102 at edges other than the first edge 111. For example, the barrier structure 108 is relatively close to the bumps 102 on either edge of the site containing the bumps that is perpendicular to first edge 111.

Substrate 101 may include any number of device layers, dielectric layers, and metallization layers in some embodiments. A device layer, sometimes referred to as a front-end layer, may include devices, such as transistors. A dielectric layer may include organic materials, epoxies, or other materials that are electrical insulators. A metallization layer, sometimes called a back-end layer, may include conductive interconnects, such as planes, traces, and vias, to couple devices in device layers with each other and to couple devices with pads, bumps, and other interconnects for connecting with other devices. While substrate 101 can include device layers and metallization layers, it is not required. Substrate 101 may comprise any suitable material, including silicon, glass, or polymers.

Bumps 102, pillars 106, and barrier structure 108 may comprise any suitable material, including copper. In some embodiments, bumps 102 and barrier structure 108 may be formed in the same process step. Bumps 102 may include an optional solder cap. In an embodiment, barrier structure 108 may be the same material and approximately the same height as bumps 102 (which may be referred to as interconnect features). In some embodiments, barrier structure 108 may have a greater height than bumps 102. As may be seen in FIG. 1, the barrier structure 108 may have a first height that is less than a second height of the pillars 106 (which may be referred to as second interconnect features). In an embodiment, the barrier structure 108 may have a height that is less than one-half, one-third, or one-fourth the height of the pillars 106.

Figure 2:
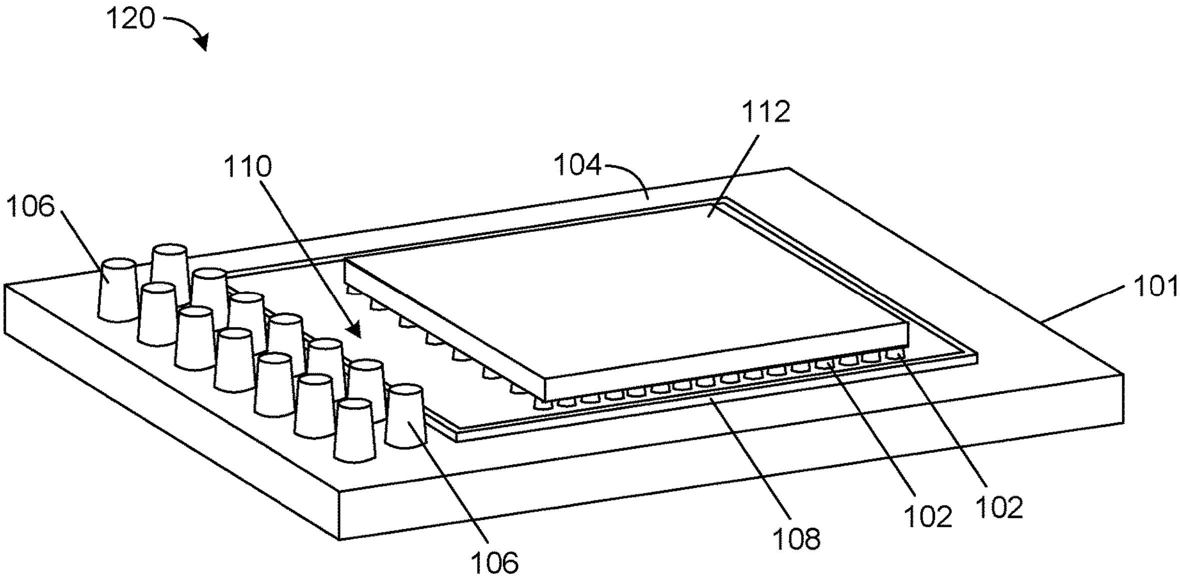
FIG. 2 is a perspective view of the IC device of FIG. 1 after an IC die has been placed on the substrate according to an embodiment.

FIG. 2 is a perspective view of an IC device 120 comprising the substrate 101 after IC die 112 is placed on the substrate according to an embodiment. The bumps 102 are between a surface of IC die 112 facing the substrate 101 and the substrate 101. Bumps 102 are laterally separated from one another by spaces in the area between IC die 112 and substrate 101. The gap between the IC die 112 and the substrate 101 may be approximately the same as the height of the bumps in some embodiments.

IC die 112 may include any number of device layers, dielectric layers, and metallization layers in some embodiments. IC die 112 may be capable of performing any desired function or functions. For example, IC die 112 may comprise a wireless radio circuit, microprocessor circuit, memory circuit, floating point gate array (FPGA) circuit, or power management circuitry.

Figure 3:
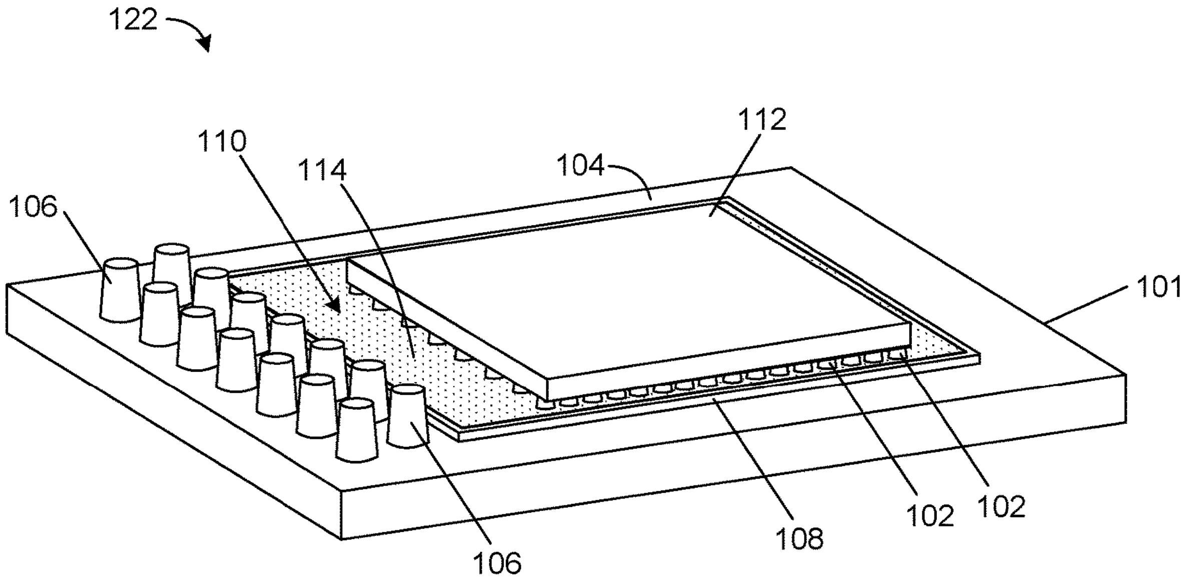
FIG. 3 is a perspective view of the IC device of FIG. 2 after a chip underfill process has been performed according to an embodiment.

FIG. 3 is a perspective view of an IC device 122 comprising the substrate 101 and IC die 112 after a chip underfill process has been performed according to an embodiment. Underfill 114 may be dispensed into region 110 from where it can flow under IC die 112. FIG. 3 shows underfill 114 after it has flowed under IC die 112 and into the spaces in the area between IC die 112 and substrate 101. As may be seen in FIG. 3, underfill 114 is contained by barrier structure 108 and, advantageously, pillars 106 can be formed close to IC die 112 without the underfill 114 contacting the pillars 106. In some embodiments, underfill 114 is an epoxy underfill, though other underfill materials may be used. In some embodiments, underfill 114 may include epoxy and a filler material, such as a nanofiller. Pillars 106 may connect with substrate 101 on one end and an IC die on an opposite end. Similarly, IC die 112 may connect with substrate 101 on one side and an IC die on an opposite side. Embodiments with multiple stacked die of various sizes and multiple vias between a package substrate and top die are next described.

Figure 4:
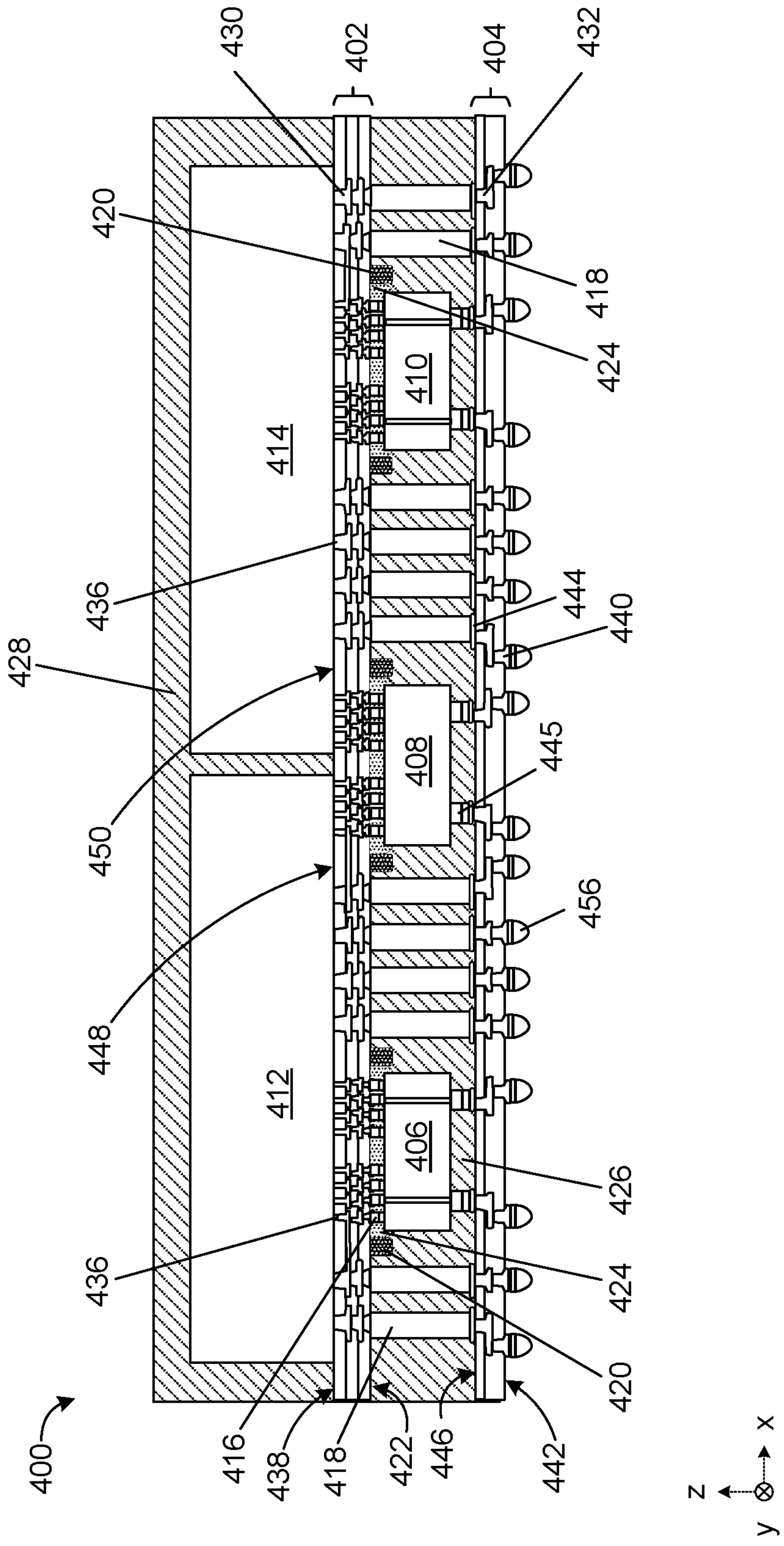
FIG. 4 is a cross-sectional view of an IC device having a plurality of barrier features on a first surface of a base structure and top IC dies in direct contact with a second surface opposite the first surface of the base structure according to an embodiment.

FIG. 4 is a cross-sectional view of an IC device 400 having a plurality of barrier features on a first surface of a base structure to arrest flow of underfill material and top IC dies in direct contact with a second surface opposite the first surface of the base structure. In various embodiments, IC device 400 comprises first and second base structures 402 and 404, first IC die 406, second IC die 408, third IC die 410, fourth IC die 412, and fifth IC die 414. A plurality of first interconnect features 416, a plurality of second interconnect features 418, and a plurality of barrier features 420 are at a first surface 422 of the first base structure 402. In addition, IC device 400 comprises underfill material 424 on the first surface 422 and mold material 426, 428 encapsulating the IC dies.

In various embodiments, each of the first and second base structures 402, 404 comprise a plurality of layers first fabricated upon a sacrificial substrate, and subsequently separated from the sacrificial substrate. The layers of base structures 402, 404 comprise dielectric material and respective metallization features 430, 432 embedded within the dielectric material. Metallization features 430, 432 may comprise any suitable metal(s), such as, but not limited to, copper alloys.

Metallization features 430 of first base structure 402 may be connected with various ones of the first interconnect features 416 and second interconnect features 418, and with various first contacts 436 of the first base structure 402 at a second surface 438 opposite the first surface. Second base structure 404 comprises a plurality of second contacts 440 at a third surface 442, and a plurality of third contacts 444 at a fourth surface 446 opposite the third surface. Metallization features 432 of second base structure 404 may be connected with various ones of the second contacts 440 and third contacts 444 facing IC dies 412, 414.

The plurality of first interconnect features 416 first base structure 402 are connected with respective contacts of first IC die 406, second IC die 408, and third IC die 410 at respective surfaces of the IC dies facing first surface 422. IC dies 406, 408, and 410 are connected to the second base structure 404 by fourth contacts 445, at respective surfaces of the IC dies 406, 408, and 410 facing fourth surface 446.

The plurality of second interconnect features 418 are connected with various ones of third contacts 444 of second base structure 404. The plurality of barrier features 420 may be between first interconnect features 416 connected with one of the IC dies 406, 408, 410, and second interconnect features 418 adjacent to a respective one of the IC dies 406, 408, or 410. The plurality of barrier features 420 may have any of the features, properties, and positional relationships of other barrier features described elsewhere herein.

Fourth IC die 412 includes a fifth surface 448 comprising contacts or pads at the fifth surface. Fourth IC die is interconnected by first base structure 402 with first IC die 406 and second IC die 408. Contacts or pads of the fourth die 412 at fifth surface 448 may be in direct contact and fused with respective first contacts 436 of first base structure 402 at second surface 438. In addition, insulators at second surface 438 and fifth surface 448 may be fused together.

Fifth IC die 414 includes a sixth surface 450 comprising contacts or pads at the surface. Fifth IC die 414 is interconnected by first base structure 402 with third IC die 410 and second IC die 408. Contacts or pads of the fifth IC die 414 at sixth surface 450 may be in direct contact and fused with respective first contacts 436 of first base structure 402 at second surface 438. In addition, insulators at second surface 438 and sixth surface 450 may be fused together.

Underfill material 424 is on first surface 422 between each of first IC die 406, second IC die 408, and third IC die 410, and first base structure 402. Underfill material 424 may be provided in a manufacturing step in which IC dies 406, 408, and 410, and first base structure 402 are inverted from the view shown in FIG. 4. In the inverted configuration, barrier features 420 may prevent the underfill material 424 from flowing into contact with any of the second interconnect features 418. In a manufacturing step after underfill material 424 is cured and solidified, IC dies 406, 408, and 410, and first base structure 402 may be flipped to the orientation shown in FIG. 4.

Mold material 426 on first surface 422 of first base structure 402 encapsulates each of the second interconnects 418 and each of first IC die 406, second IC die 408, and third IC die 410, including underfill material 424. Mold material 426 may also surround and contact second interconnect features 418, and may contact a sidewall of barrier features 420. In addition, the mold material 426 may contact fourth surface 446 of second base structure 404. Mold material 428 on second surface 438 of first base structure 402 encapsulates each of fourth and fifth IC dies 412, 414.

Solder balls 456, e.g., C4 bumps, may be provided at second contacts 440 of second base structure 404.

Figure 5:
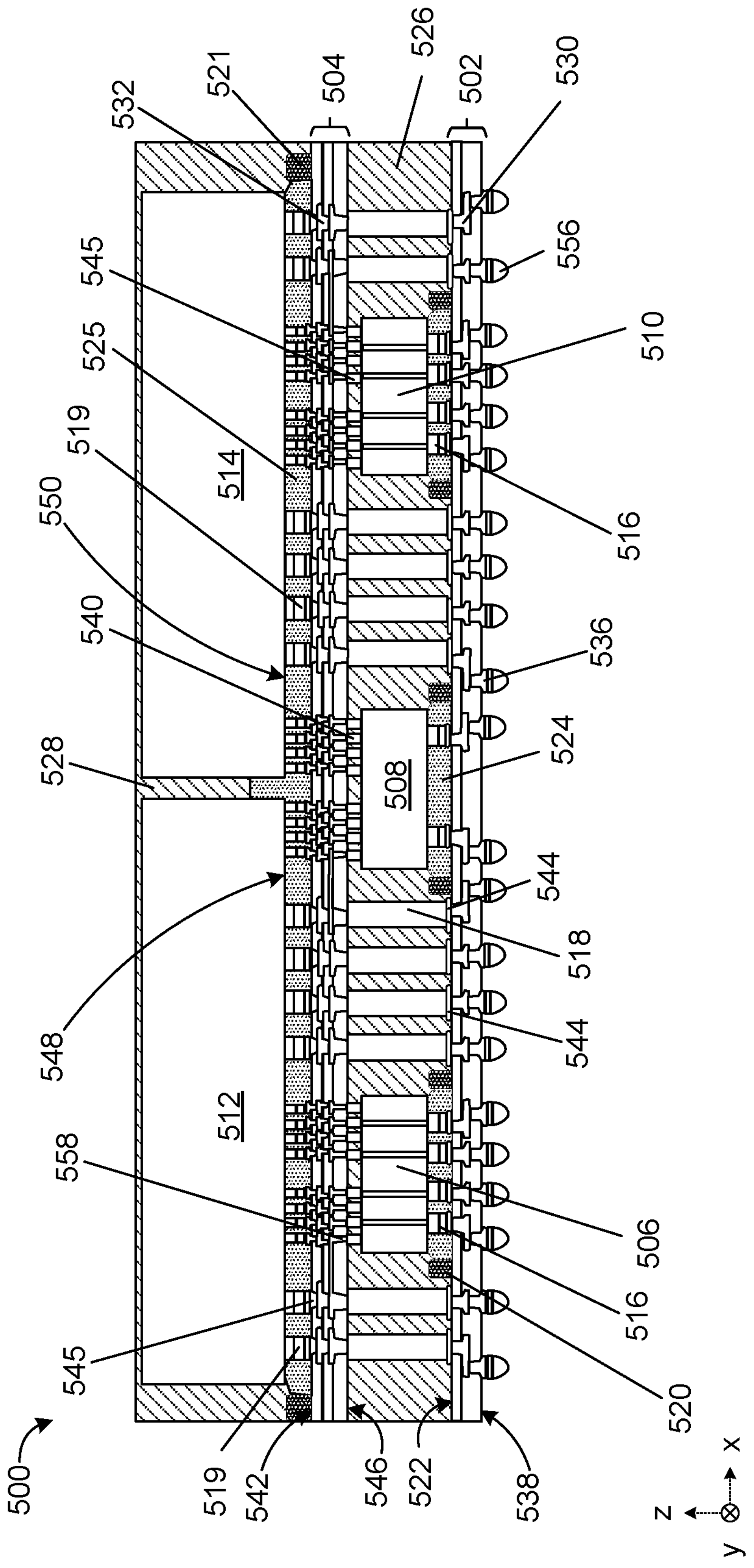
FIG. 5 is a cross-sectional view of an IC device having a plurality of first barrier features on a surface of a first base structure, a plurality of second barrier features on a surface of a second base structure, and top IC dies connected with the first base structure by first interconnect features according to an embodiment.

FIG. 5 is a cross-sectional view of an IC device 500 having a plurality of first barrier features on a surface of a first base structure to arrest flow of underfill material, a plurality of second barrier features on a surface of a second base structure to arrest flow of underfill material, and top IC dies connected with the first base structure by first interconnect features, which may be solder features.

In various embodiments, IC device 500 comprises first and second base structures 502 and 504, first IC die 506, second IC die 508, third IC die 510, fourth IC die 512, and fifth IC die 514. A plurality of first interconnect features 516, a plurality of second interconnect features 518, and a plurality of first barrier features 520 are at a first surface 522 of the first base structure 502. A plurality of third interconnect features 519 and a plurality of second barrier features 521 are at a third surface 542 of the second base structure 504. In addition, IC device 500 comprises first underfill on first surface 522 and second underfill 525 on third surface 542. Mold material 526, 528 is provided to encapsulate the IC dies.

In various embodiments, each of the first and second base structures 502, 504 comprise a plurality of layers first fabricated upon a sacrificial substrate, and subsequently separated from the sacrificial substrate. The layers of base structures 502, 504 comprise dielectric material and respective metallization features 530, 532 embedded within the dielectric material. Metallization features 530, 532 may comprise any suitable metal(s), such as, but not limited to, copper alloys.

Metallization features 530 of first base structure 502 may be connected with various ones of the first interconnect features 516 and second interconnect features 518 by various third contacts 544 at first surface 522. Metallization features 530 are also connected with first contacts 536 of the first base structure 502 at second surface 538. Second base structure 504 comprises a plurality of fourth contacts or pads 545 at a third surface 542, and a plurality of fifth contacts or pads 558 at a fourth surface 546. Metallization features 532 of second base structure 504 may be connected with various ones of the fourth contacts 545 and fifth contacts 558.

The plurality of first interconnect features 516 of first base structure 502 are connected with respective contacts of first IC die 506, second IC die 508, and third IC die 510 at respective surfaces of the IC dies facing first surface 522. IC dies 506, 508, and 510 are connected to the second base structure 504 by second contacts 540, at respective surfaces of the IC dies 506, 508, and 510 facing fourth surface 546.

The plurality of second interconnect features 518 are connected with various ones of third contacts 544 of first base structure 502. The plurality of first barrier features 520 may be between first interconnect features 516 connected with one of the IC dies 506, 508, 510, and second interconnect features 518 adjacent to a respective one of the IC dies 506, 508, or 510. The plurality of first barrier features 520 may have any of the features, properties, and positional relationships of other barrier features described elsewhere herein.

Fourth IC die 512 includes a fifth surface 548 comprising contacts or pads at the fifth surface. Fourth IC die is interconnected by second base structure 504 with first IC die 506 and second IC die 508. Contacts or pads of the fourth die 512 at fifth surface 548 may be connected with third interconnect features 519, which may be solder features, on second base structure 504.

Fifth IC die 514 includes a sixth surface 550 comprising contacts or pads at the sixth surface. Fifth IC die 514 is interconnected by second base structure 504 with third IC die 510 and second IC die 508. Contacts or pads of the fifth IC die 514 at sixth surface 550 may be connected with third interconnect features 519, which may be solder features, on second base structure 504. In addition, insulators at second surface 438 and sixth surface 450 may be fused together.

First underfill material 524 is on first surface 522 between each of first IC die 506, second IC die 508, and third IC die 510, and first base structure 502. Second underfill material 525 is on third surface 542 between each of fourth IC die 512, and fifth IC die 514, and second base structure 504.

First mold material 526 on first surface 522 of first base structure 502 each of first IC die 506, second IC die 508, and third IC die 510, including underfill material 524. First mold material 526 may also surround and contact second interconnect features 518, and may contact a sidewall of barrier features 520. In addition, the first mold material 526 may contact fourth surface 546 of second base structure 504. Second mold material 528 on third surface 542 of second base structure 504 encapsulates each of fourth and fifth IC dies 512, 514, including second underfill material 525.

Solder balls 556, e.g., C4 bumps, may be provided at second contacts 550 of second base structure 504.

Figure 6:
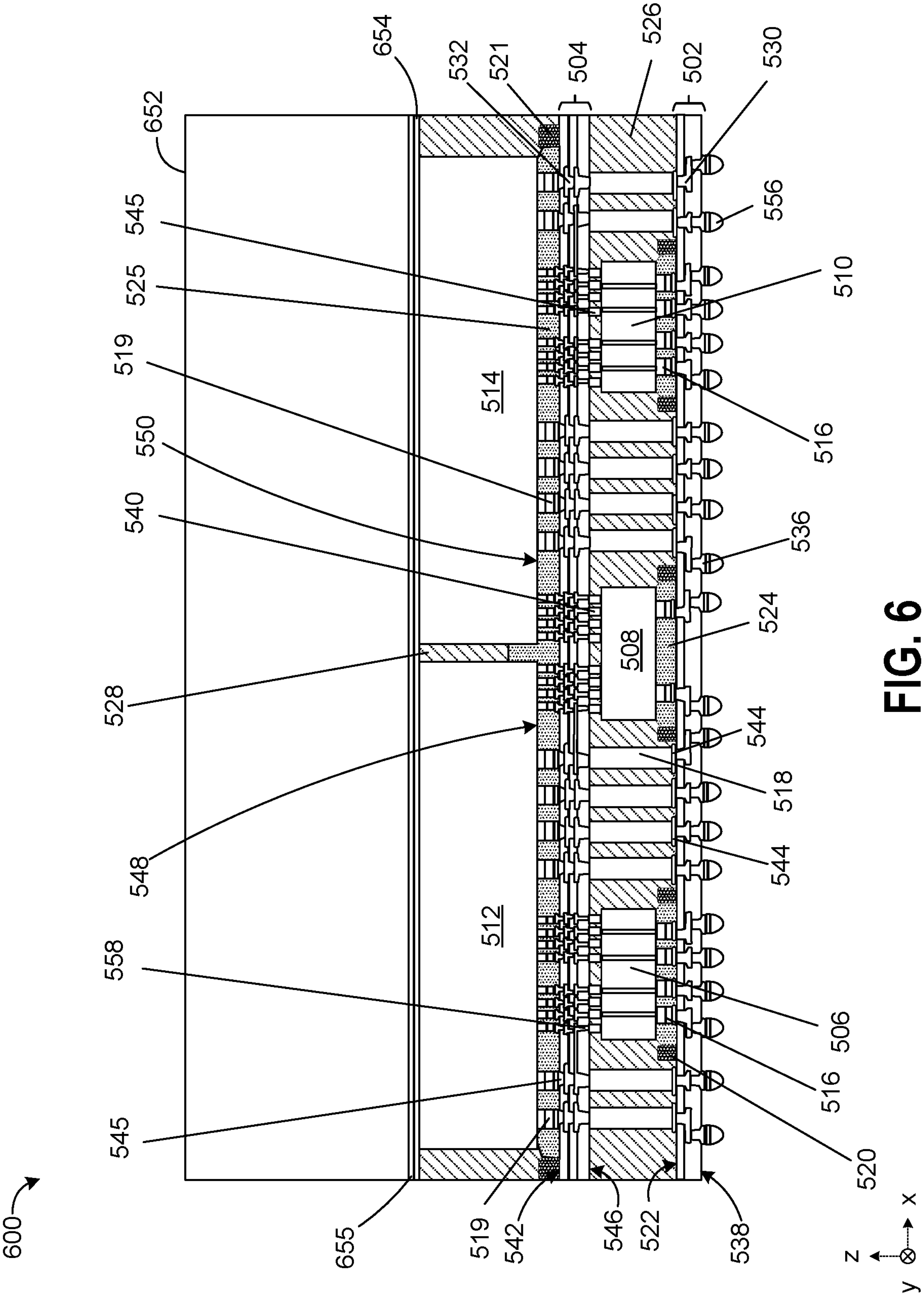
FIG. 6 is a cross-sectional view of an IC device having a plurality of first barrier features on a surface of a first base structure, a plurality of second barrier features on a surface of a second base structure, top IC dies connected with the first base structure by first interconnect features, and a heat spreader according to an embodiment.

FIG. 6 is a cross-sectional view of an IC device 600 having a plurality of first barrier features on a surface of a first base structure to arrest flow of underfill material, a plurality of second barrier features on a surface of a second base structure to arrest flow of underfill material, top IC dies connected with the first base structure by first interconnect features, which may be solder features, and a heat spreader. IC device 600 comprises IC device 500 and a heat spreader 652. Heat spreader 652 may be a bulk substrate comprising predominantly silicon (e.g., substantially single-crystalline silicon). Heat spreader 652 may include a bond material 655. Heat spreader 652 is bonded to a back-side bond material 654 on IC dies 512, 514.

Figure 7:
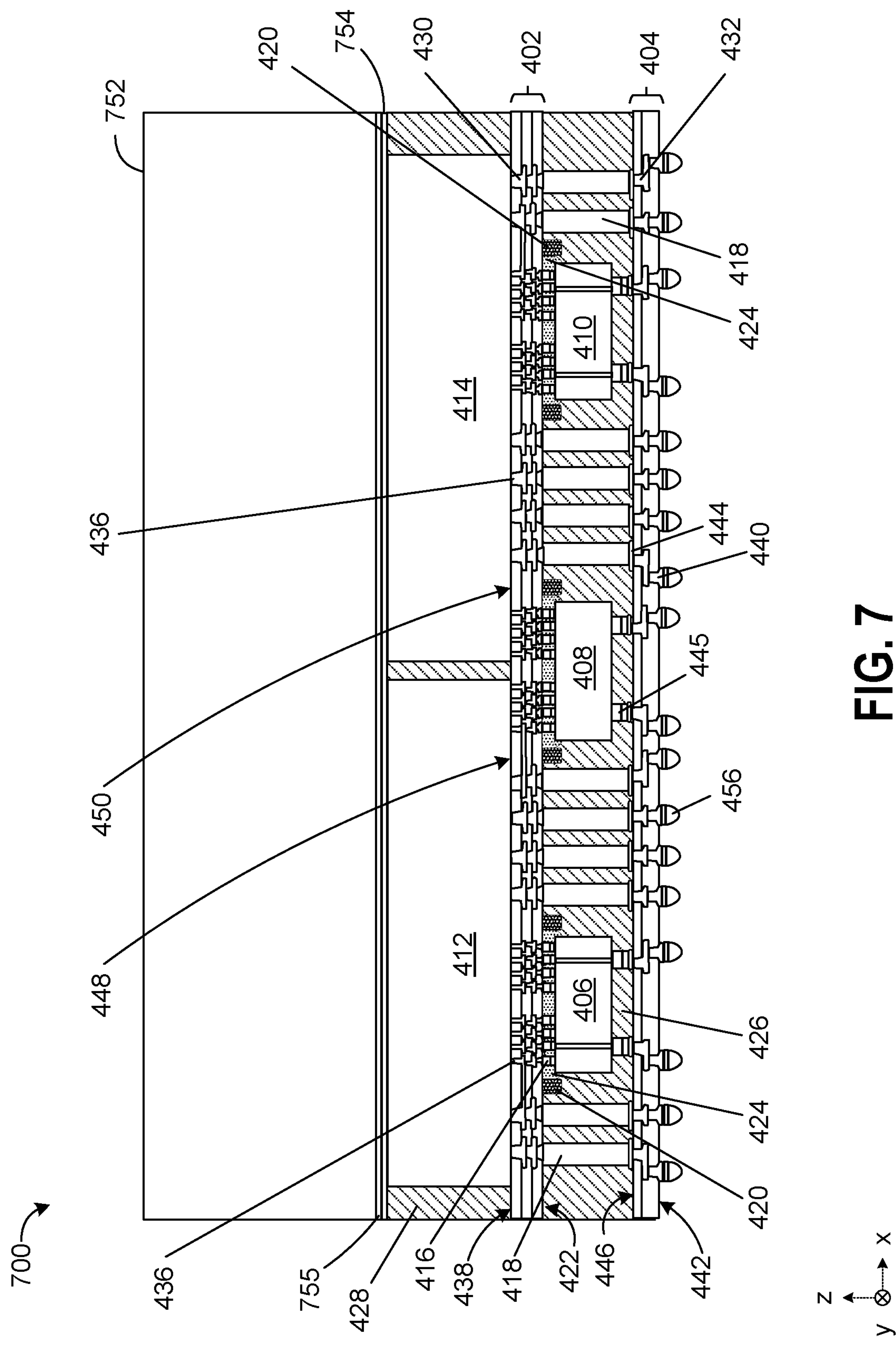
FIG. 7 is a cross-sectional view of an IC device having a plurality of barrier features on a first surface of a base structure, top IC dies in direct contact with a second surface opposite the first surface of the base structure, and a heat spreader according to an embodiment.

FIG. 7 is a cross-sectional view of an IC device 600 having a plurality of barrier features on a first surface of a base structure to arrest flow of underfill material, top IC dies in direct contact with a second surface opposite the first surface of the base structure, and a heat spreader. IC device 700 comprises IC device 400 and a heat spreader 752. Heat spreader 652 may be a bulk substrate comprising predominantly silicon (e.g., substantially single-crystalline silicon). Heat spreader 752 may include a bond material 755. Heat spreader 752 is bonded to a back-side bond material 754 on IC dies 412, 414.

Figure 8:
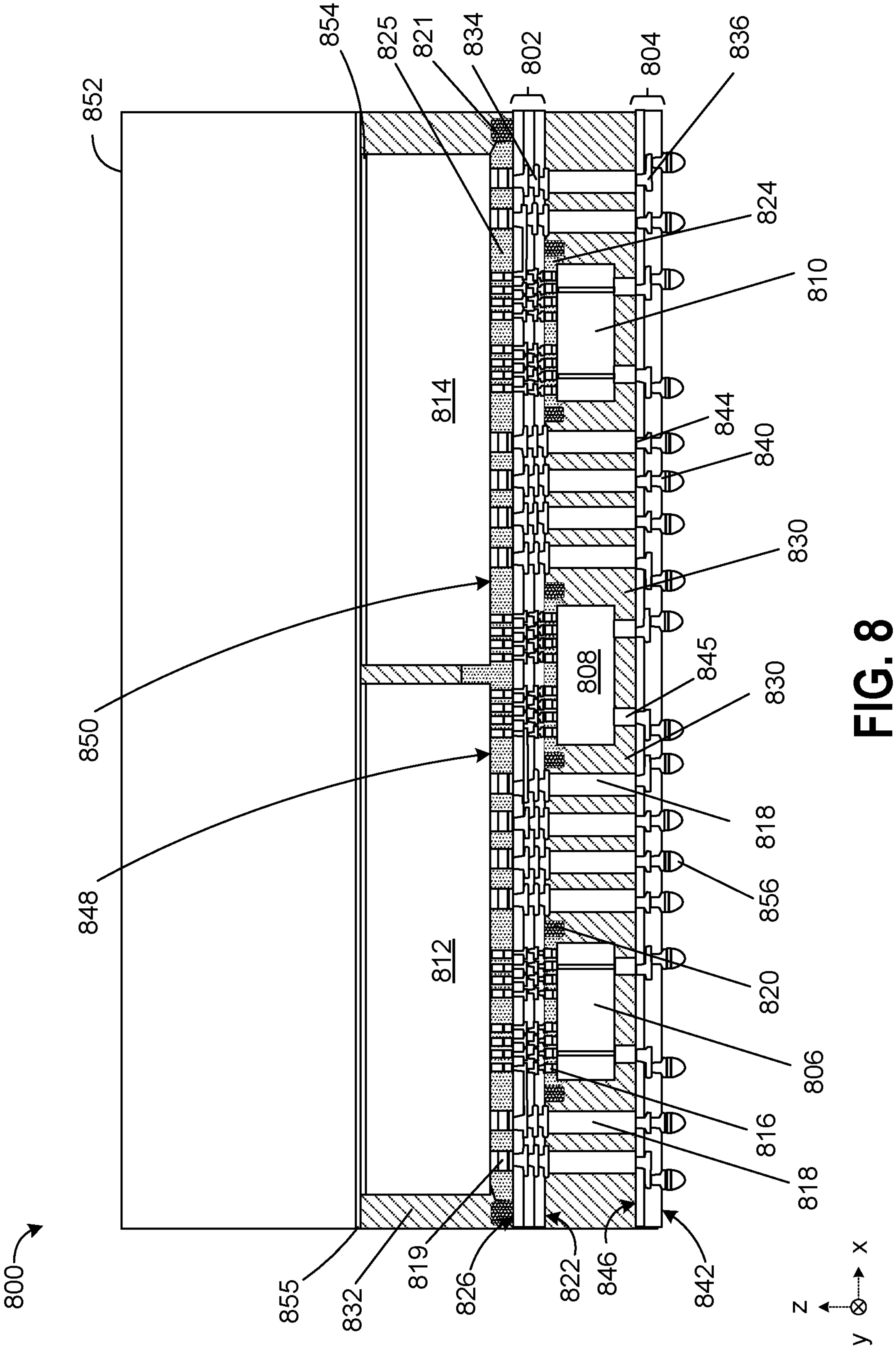
FIG. 8 is a cross-sectional view of an IC device having a plurality of barrier features on a first surface of a base structure, a second plurality of barrier features on a second surface of the base structure, top IC dies connected with the second surface by solder connections, and a heat spreader according to an embodiment.

FIG. 8 is a cross-sectional view of an IC device 800 having a plurality of barrier features on a first surface of a base structure to arrest flow of underfill material, a second plurality of barrier features on a second surface opposite the first surface of the base structure to arrest flow of underfill material, top IC dies connected with the second surface by solder connections, and a heat spreader.

In various embodiments, IC device 800 comprises first and second base structures 802 and 804, first IC die 806, second IC die 808, third IC die 810, fourth IC die 812, and fifth IC die 814. A plurality of first interconnect features 816, a plurality of second interconnect features 818, and a plurality of first barrier features 820 are at a first surface 822 of the first base structure 802. In addition, IC device 800 comprises first underfill material 824 on the first surface 822. A plurality of third interconnect features 819 and a plurality of second barrier features 821 are at a second surface 826 of the first base structure 802. A second underfill material 828 is on the second surface 826. Mold material 830, 832 is provided for encapsulating the IC dies.

In various embodiments, each of the first and second base structures 802, 804 comprise a plurality of layers first fabricated upon a sacrificial substrate, and subsequently separated from the sacrificial substrate. The layers of base structures 802, 804 comprise dielectric material and respective metallization features 834, 836 embedded within the dielectric material. Metallization features 834, 836 may comprise any suitable metal(s), such as, but not limited to, copper alloys.

Metallization features 834 of first base structure 802 may be connected with various ones of the first interconnect features 816 and second interconnect features 818, and with various third interconnect features 819 at second surface 826. Second base structure 804 comprises a plurality of second contacts 840 at a third surface 842, and a plurality of third contacts 844 at a fourth surface 846 opposite the third surface. Metallization features 836 of second base structure 804 may be connected with various ones of the second contacts 840 and third contacts 844.

The plurality of first interconnect features 816 on first base structure 802 are connected with respective contacts of first IC die 806, second IC die 808, and third IC die 810 at respective surfaces of the IC dies facing first surface 822. IC dies 806, 808, and 810 are connected to the second base structure 804 by fourth contacts 845, at respective surfaces of the IC dies 806, 808, and 810 facing fourth surface 846.

The plurality of second interconnect features 818 are connected with various ones of third contacts 844 of second base structure 804. The plurality of first barrier features 820 may be between first interconnect features 816 connected with one of the IC dies 806, 808, 810, and second interconnect features 818 adjacent to a respective one of the IC dies 806, 808, or 810. The plurality of first barrier features 820 may have any of the features, properties, and positional relationships of other barrier features described elsewhere herein.

Fourth IC die 812 includes a fifth surface 848 comprising contacts or pads at the fifth surface. Fourth IC die is interconnected by first base structure 802 with first IC die 806 and second IC die 808. Contacts or pads of the fourth die 812 at fifth surface 448 may be connected with third interconnect features 819, which may be solder features, on first base structure 802.

Fifth IC die 814 includes a sixth surface 850 comprising contacts or pads at the surface. Fifth IC die 814 is interconnected by first base structure 802 with third IC die 810 and second IC die 808. Contacts or pads of the fifth IC die 814 at sixth surface 450 may be connected with third interconnect features 819, which may be solder features, on first base structure 502.

First underfill material 824 is on first surface 822 between each of first IC die 806, second IC die 808, and third IC die 810, and first base structure 802. Second underfill material 825 is on second surface 826 between each of fourth IC die 812, and fifth IC die 814, and first base structure 802.

First mold material 830 on first surface 822 of first base structure 802 is on each of first IC die 806, second IC die 808, and third IC die 810, including first underfill material 824. First mold material 830 may also surround and contact second interconnect features 818, and may contact a sidewall of first barrier features 820. In addition, the first mold material 830 may contact fourth surface 846 of second base structure 504. Second mold material 832 on second surface 826 of first base structure 502 encapsulates each of fourth and fifth IC dies 812, 814, including second underfill material 825. Second mold material 832 may contact a sidewall of second barrier features 821.

IC device 800 comprises a heat spreader 852. Heat spreader 852 may be a bulk substrate comprising predominantly silicon (e.g., substantially single-crystalline silicon). Heat spreader 852 may include a bond material 855. Heat spreader 852 is bonded to a back-side bond material 854 on IC dies 812, 814. Solder balls 856, e.g., C4 bumps, may be provided at second contacts 840 of second base structure 804.

Figure 9:
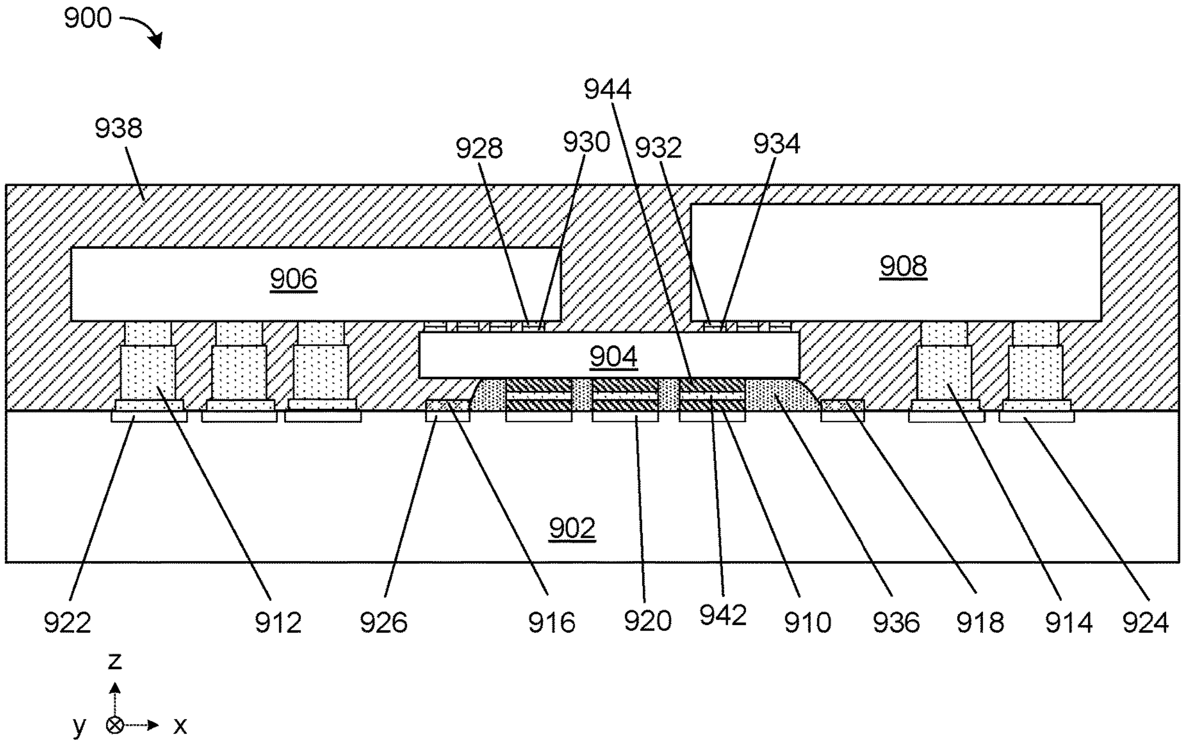
FIG. 9 is a cross-sectional view of an IC device comprising a barrier feature on a surface of an IC device substrate to arrest the flow of underfill material according to various embodiments.

FIG. 9 is a cross-sectional view of an IC device 900. In various embodiments, IC device 900 comprises an IC device package substrate 902, a first IC die 904, a second IC die 906, a third IC die 908, first, second, and third interconnect features 910, 912, and 914, barrier features 916 and 918, contacts 920, 922, 924, and 926, fourth, fifth, sixth, and seventh interconnect features 930, 928, 934, and 932, underfill material 936, and mold material 938. In addition, IC device 900 may include solder 942 and eighth interconnect features 944.

IC device package substrate 902 may include any number of device layers, dielectric layers, and metallization layers in some embodiments. While substrate 101 can include device layers and metallization layers, it is not required. Substrate 101 may comprise any suitable material, including silicon, glass, or polymers. Each of the first, second, and third IC die 904, 906, and 908 may include any number of device layers, dielectric layers, and metallization layers in some embodiments. Each of the first, second, and third IC die 904, 906, and 908 may be capable of performing any desired function or functions, e.g., wireless radio, processor, memory, input/output, programmable logic, or power management functions.

IC device package substrate 902 includes a plurality of first interconnect features 910 to couple to the first IC die 904, a plurality of second interconnect features 912 to couple to the second IC die 906, and a plurality of third interconnect features 914 to couple to the third IC die 908. First interconnect features 910 may be similar to bumps 102. First interconnect features 910 may include solder 942, e.g., solder caps, and may be coupled to the first IC die 904 via interconnect features 944 on a surface or in a top layer of first IC die 904. In some embodiments, the first interconnect features 910 may be a copper pad, such as a pad in layer 1 for a top-die last, Omni-directional process. Second interconnect features 912 and third interconnect features 914 may be similar to pillars 106.

Each of the first interconnect features 910 may be coupled with a respective contact 920 on a surface or in a top layer of package substrate 902. Each of the second interconnect features 912 may be coupled with a respective contact 922 on a surface or in a top layer of package substrate 902. Each of the third interconnect features 914 may be coupled with a respective contact 924 on a surface or in a top layer of package substrate 902. The term "contact" may be used to refer to a metal contact, pad, metallization feature, or other interconnect structure.

Second and third interconnect features 912, 914 may have a height which is greater than the height of first interconnect features 910 or which is greater than the height of barrier features 916, 918. The second and third interconnect features 912, 914 may have a height which is greater than the height of first interconnect features 910 (or total height of the sum of first interconnect features 910, interconnect features 944, and solder 942), or a height that is greater than the distance from a surface of package substrate 902 facing first IC die 904 to a surface of one of the second IC die 906 or third IC die 908 facing the package substrate 902. In some embodiments, the height of first interconnect features 910 (or total height of the sum of first interconnect features 910, interconnect features 944, and solder 942) may be less than one-fourth, one-third, or one-half the height of the second or third interconnect features 912, 914.

IC device package substrate 902 includes one or more barrier features 916 and 918 on the surface of the substrate 902. Barrier features 916 and 918 may be formed on a respective contact 926 on a surface or in a top layer of package substrate 902. Barrier feature 916 is between second interconnect features 912 and first interconnect features 910 in the x-direction, and between device package substrate 902 and first IC die 904 in the z-axis direction. Barrier feature 918 is between third interconnect features 914 and first interconnect features 910 in the x-direction, and outside of the site where IC die 904 is to be placed, i.e., barrier feature 918 is not between the device package substrate 902 and the first IC die 904. In embodiments, barrier feature 916 and 918 may comprise a metal. One or more barrier features may have substantially the same composition as a first interconnect feature 910, second interconnect feature 912, or third interconnect feature 914. In embodiments, a barrier feature may comprise a polymer or a glass.

First IC die 904 may include a plurality of fourth interconnect features 930 to couple to fifth interconnect features 928 of second IC die 906, and a plurality of sixth interconnect features 934 to couple to seventh interconnect features 932 of third IC die 908. Fourth, fifth, sixth, and seventh interconnect features 930, 928, 934, and 932 may comprise a metal. In some embodiments, fourth and fifth interconnect features 930 and 928 are in direct contact. In some embodiments, fourth and fifth interconnect features 930 and 928 are coupled via a solder material. In some embodiments, sixth and seventh interconnect features 934 and 932 are in direct contact. In some embodiments, sixth and seventh interconnect features 934 and 932 are coupled via a solder material.

In embodiments, underfill material 936 is on a surface of package substrate 902 facing first IC die 904. Underfill material 936 is in one or more of the spaces adjacent to at least one of the first interconnect features 910 between package substrate 902 and first IC die 904. Underfill material 936 may also be adjacent to any solder cap 942 of a first interconnect feature 910, as well as to an interconnect feature 944 with which a first interconnect feature 910 is connected. Underfill material 936 may be in areas adjacent to the site of first IC die 904 up to a barrier feature where its flow, when liquid, is arrested. In embodiments, underfill material 936 is in contact with a first sidewall of at least one of the barrier features proximal to the first interconnect features 910, such as barrier features 916 and 918. In some embodiments, underfill material 936 may be a first package dielectric material. Underfill material 936 may be an organic material, such as an epoxy, and may include fillers, such as a nanofiller.

In embodiments, mold material 938 is on a surface of package substrate 902 facing second IC die 906. Mold material 938 is also on a surface of package substrate 902 facing third IC die 908. Mold material 938 is in one or more of the spaces adjacent to second interconnect features 912 between package substrate 902 and second IC die 906. Mold material 938 is also in one or more of the spaces adjacent to third interconnect features 914 between package substrate 902 and third IC die 908. Mold material 938 may contact a barrier feature, though this is not essential. In some embodiments, the mold material is over a barrier feature and is in contact with the underfill, e.g., mold material 940 is over barrier feature 918 and in contact with underfill 936. In some embodiments, mold material 938 is in contact with a sidewall or backside of first IC die 904. As may be seen in FIG. 9, mold material 938 contacts a sidewall of barrier feature 916 that is closest to the second interconnect features 912, and mold material 938 also contacts a sidewall of barrier feature 918 that is closest to the third interconnect features 914. These sidewalls that are in contact with mold material may be opposite the first sidewall of the barrier features proximal to the first interconnect features 910, which are in contact with underfill material 936. Mold material 938 also contacts a topside of barrier feature 918 perpendicular to the sidewalls of barrier feature 918. This topside is opposite to a side of barrier feature 918 facing package substrate 902. Mold material 938 may be any suitable an organic material or organic plastic material, such as an epoxy material. Mold material 938 may have a relatively low electrical conductivity, and may advantageously being a dielectric. Any alternative material known to be suitable for IC chip packaging applications may be used as mold material 938. In some exemplary embodiments, the molding compound comprises a cured (e.g., thermoset) resin or polymer comprising epoxy and/or silicone. The molding compound may also comprise a variety of fillers. In embodiments, the mold materials 938 may be second package dielectric materials, and the second package dielectric materials may have a different composition than the first package dielectric material. In embodiments, mold material 938 may be a second package dielectric material adjacent to a sidewall of at least one of the plurality of second interconnect features 912 and in contact with a second sidewall of barrier feature 916 proximal to the second interconnect features 912.

FIGS. 10A, 10B, 11A, 11B, 11C, 12A, 12B, 13A, 13B, 14A, and 149B illustrate a composite IC device having a barrier feature on an IC device package substrate to arrest the flow of underfill material at various of steps manufacture according to some embodiments.

Figure 10A:
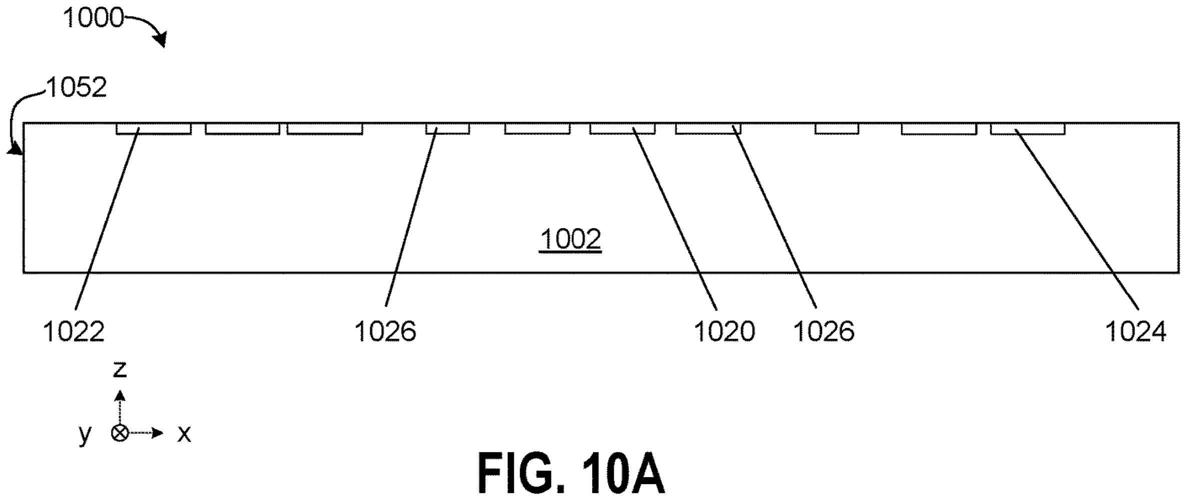
FIGS. 10A, 10B, 11A, 11B, 11C, 12A, 12B, 13A, 13B, 14A, and 14B illustrate a composite IC device having a barrier feature on an IC device package substrate to arrest the flow of underfill material at various of steps manufacture according to some embodiments.
Figure 10B:
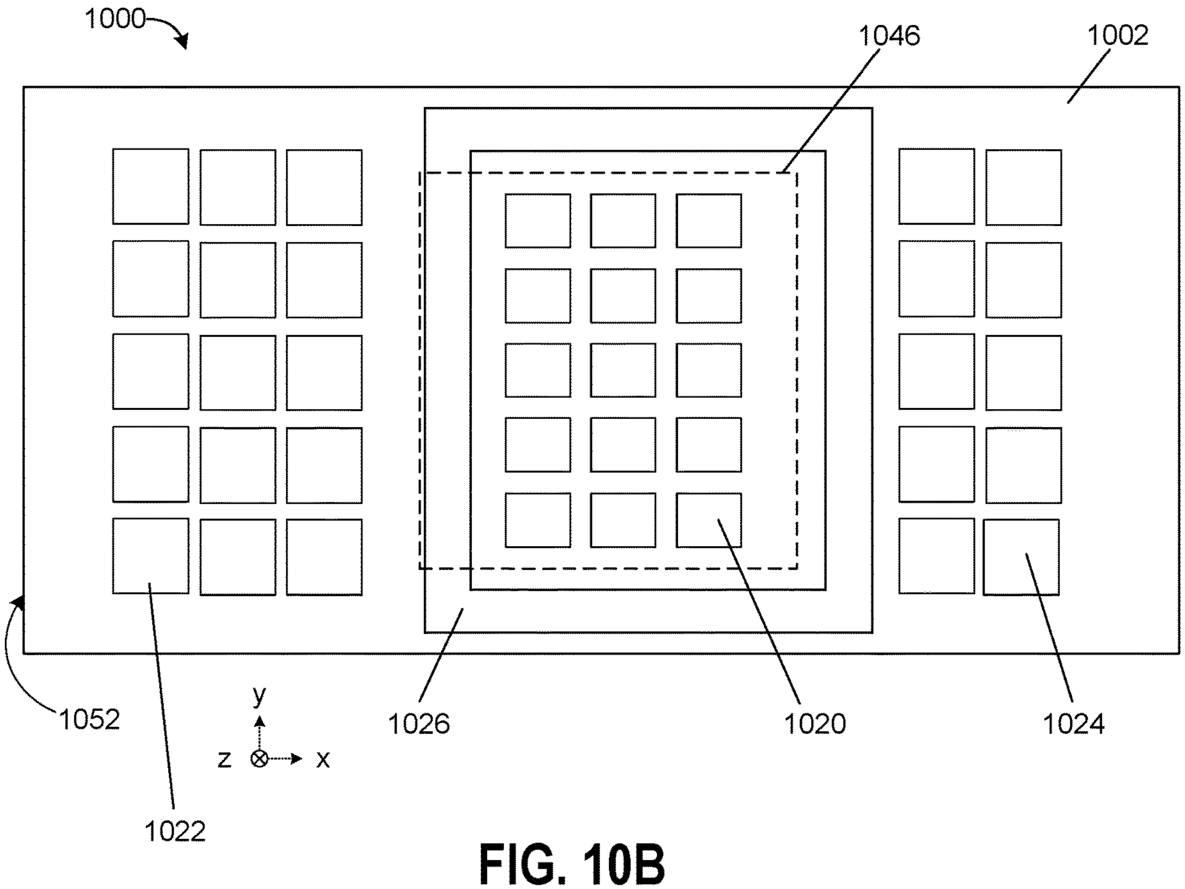

FIG. 10A is a cross-sectional view of an assembly 1000. FIG. 10B is a plan view of the assembly 1000 according to various embodiments. As shown in these figures, assembly 1000 includes an IC device package substrate 1002 having contacts 1020, 1022, 1024, and 1026. The contacts may have been created on a surface or in a top layer of package substrate 1002, and may be a metal pad or other metallization feature. FIG. 10B illustrates a site 1046 where a first IC die is to be placed in a subsequent manufacturing step.

Figure 11A:
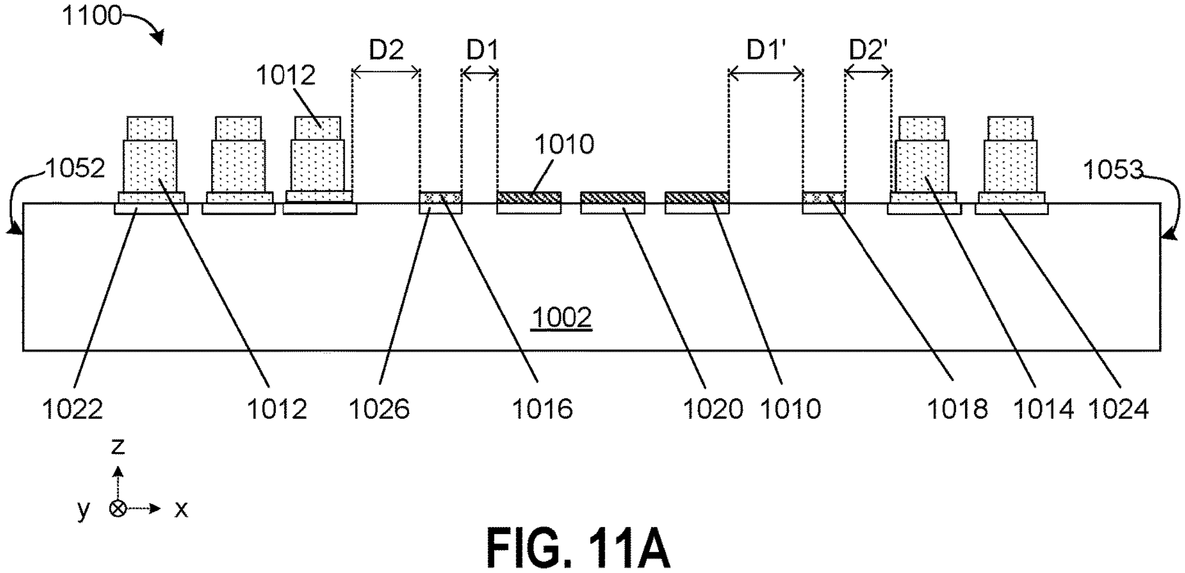
Figure 11B:
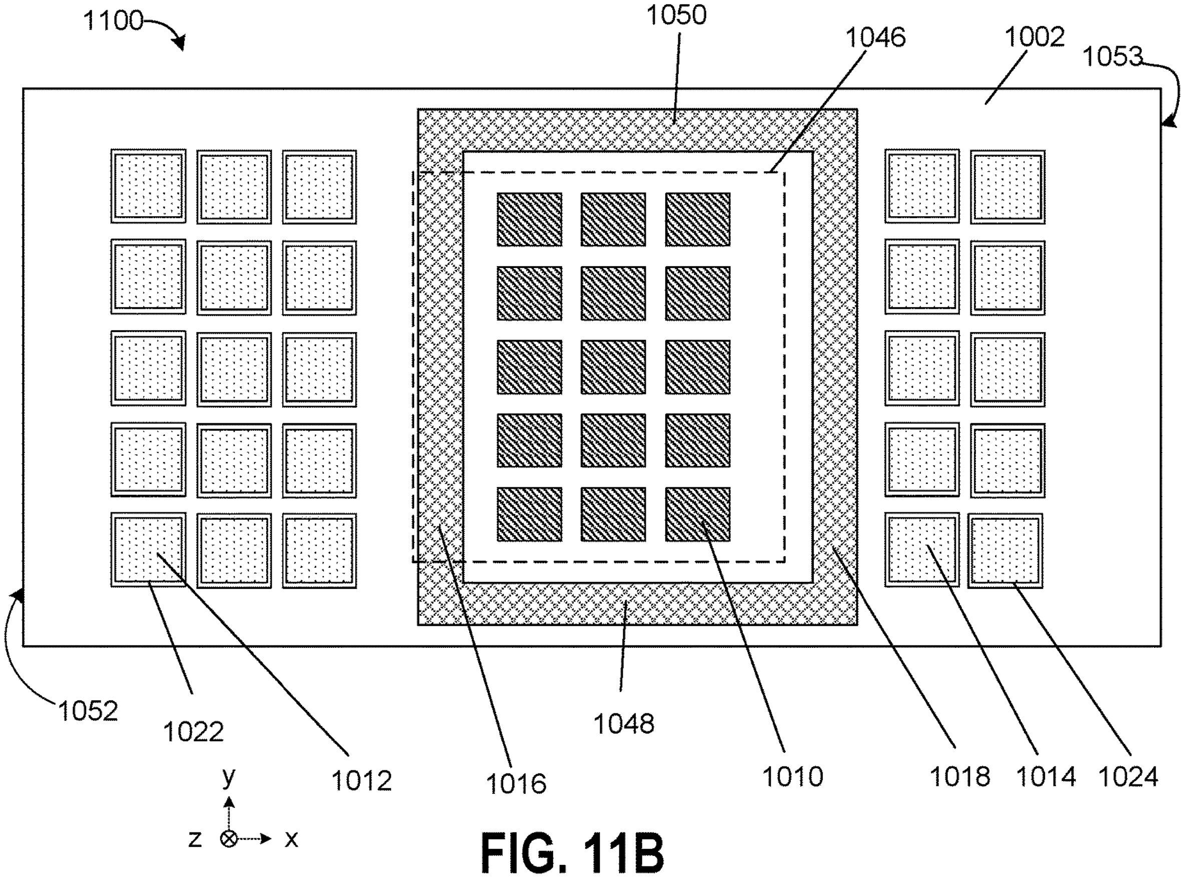

FIG. 11A is a cross-sectional view of an assembly 1100. FIG. 11B is a plan view of the assembly 1100. As shown in these figures, a plurality of first interconnect features 1010 have been formed on respective contacts 1020, a plurality of second interconnect features 1012 have been formed on respective contacts 1022, and a plurality of third interconnect features 1014 have been formed on respective contacts 1024. In some embodiments, the first interconnect features 1010 may be a copper bump. First interconnect features 1010 may optionally include a solder cap (not shown in FIGS. 11A and 11B). In some embodiments, the second and third interconnect features 1012, 1014 may be copper pillars. As shown in FIG. 11A, second and third interconnect features 1012, 1014 may have a height which is greater than the height of first interconnect features 1010. The second and third interconnect features 1012, 1014 may have several levels that are built up in several steps. In an embodiment, the second interconnect features 1012 are between the first interconnect features 1010 and a first edge 1022 of the package substrate 1002, and the third interconnect features 1014 are between the first interconnect features 1010 and a second edge 1023 of the package substrate 1002.

As shown in FIGS. 11A and 11B, one or more barrier features may be formed on contact 1026. The one or more barrier features may comprise two or more barrier segments. As shown in FIG. 11B, a first barrier segment 1016 has been formed between first interconnect features 1010 and second interconnect features 1012, and a second barrier segment 1018 has been formed between first interconnect features 1010 and second interconnect features 1014. The first and second barrier segments 1016, 1018 extend in a first direction, e.g., the y-axis direction. The one or more barrier features may comprise third and fourth barrier segments extending in a second direction, substantially orthogonal to the first direction. For example, third and fourth barrier segments 1048, 1050 extend in an x-axis direction. In some embodiments, the one or more barrier features encircle the plurality of first interconnect features 1010, and the plurality of second interconnect features 1012 are outside of a region of the surface encircled by the one or more barrier features. In some embodiments, the one or more barrier features may have a first height substantially equal to a second height of the plurality of first interconnect features 1010.

Referring to FIG. 11A, the plurality of first interconnect features 1010 are spaced apart from one or more barrier features by a first distance, and the plurality of second interconnect features 1012 are spaced apart from the one or more barrier features by a second distance, different than the first distance. For example, the first interconnect features 1010 are spaced apart from barrier segment 1016 by a first distance D1, and the plurality of second interconnect features 1012 are spaced apart from barrier segment 1016 by a second distance D2, different than the first distance. In some embodiments, the first distance D1 is less than the second distance D2. As a second example, the first interconnect features 1010 are spaced apart from barrier segment 1018 by a first distance D1', and the plurality of third interconnect features 1014 are spaced apart from barrier segment 1018 by a second distance D2', different than the first distance. In some embodiments, the first distance D1' is greater than the second distance D2'.

Figure 11C:
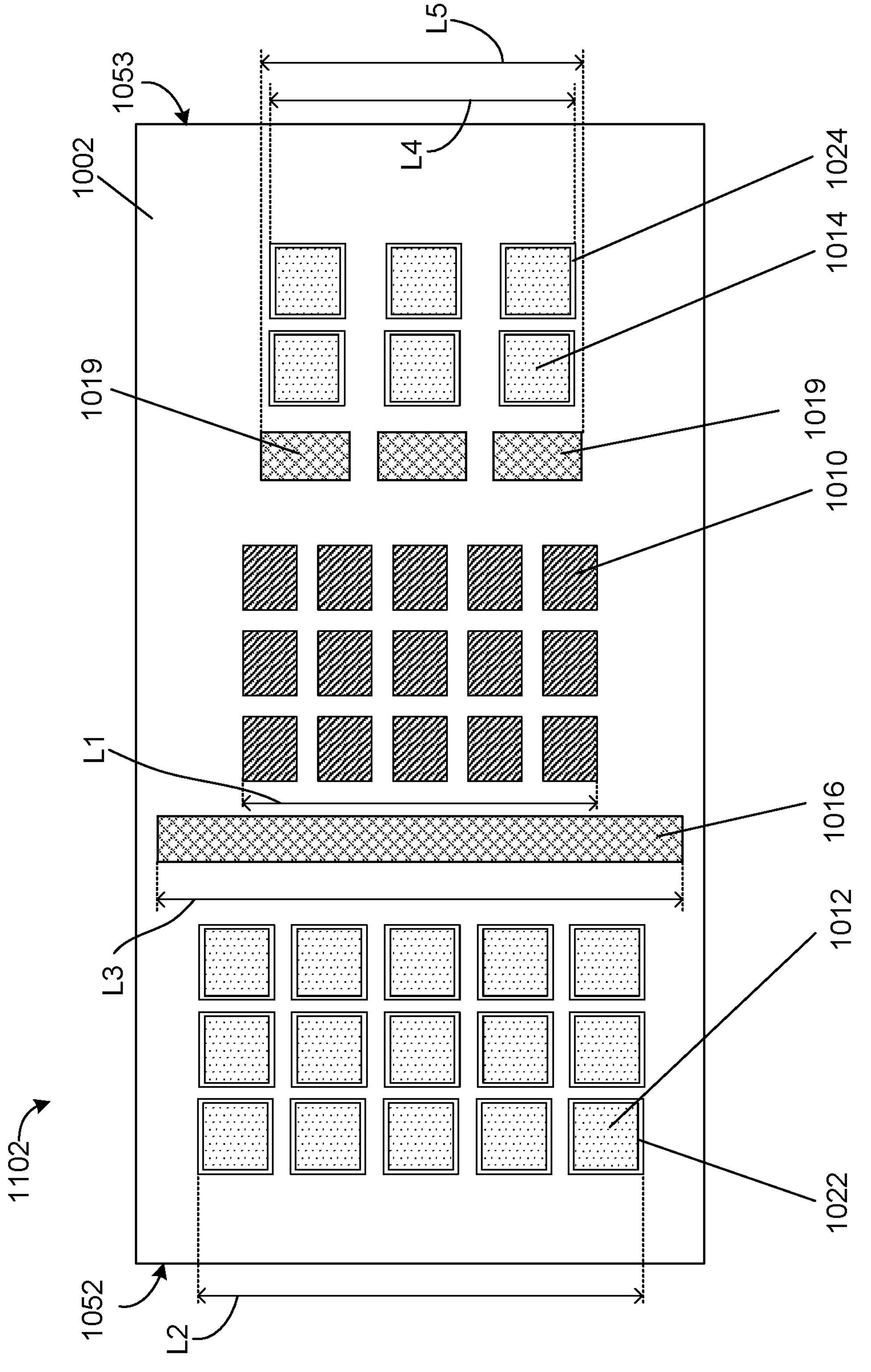
Figure 11C:
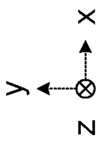

FIG. 11C is a plan view of an assembly 1102 which includes alternative barrier features according to some embodiments. As shown in FIG. 11C, a plurality of first interconnect features 1010 to couple to a first IC die have been formed on IC device package substrate 1002. The first interconnect features 1010 span a first length L1 in a first direction, e.g., in the y-axis direction, on a surface of the substrate 1002. A plurality of second interconnect features 1012 to couple to a second IC die have also been formed on substrate 1002. The second interconnect features 1012 span a second length L2 in the first direction on the surface of the substrate 1002. The second interconnect features 1012 are between the first length L1 of the first interconnect features 1010 and the first edge 1052 of the substrate 1002. In addition, a barrier feature comprising first barrier segment 1016 has been formed on the surface of the substrate 1002 and between the first and second interconnect features 1010, 1012. The first barrier segment 1016 spans a third length L3 in the first direction. In embodiments, the third length L3 may be greater than at least one of the first or second lengths L1, L2.

FIG. 11C also illustrates that a plurality of third interconnect features 1014 to couple to a third IC die have been formed on substrate 1002. The third interconnect features 1014 span a fourth length L4 in the first direction, e.g., in the y-axis direction, on the surface of the substrate 1002. The third interconnect features 1014 are between the first length L1 of the first interconnect features 1010 and the second edge 1053 of the substrate 1002. In addition, a barrier feature comprising two or more barrier segments 1019 have been formed on the surface of the substrate 1002 and between the first and third interconnect features 1010, 1014. The barrier segments 1019 span a fifth length L5 in the first direction. In embodiments, the fifth length L5 may be greater than the fourth length L4, but less than the first length L1 of the first interconnect features 1010. In some embodiments, a barrier feature comprises a plurality of colinear discrete features longitudinally spaced apart along the fifth length L5, e.g., barrier segments 1019.

Figure 12A:
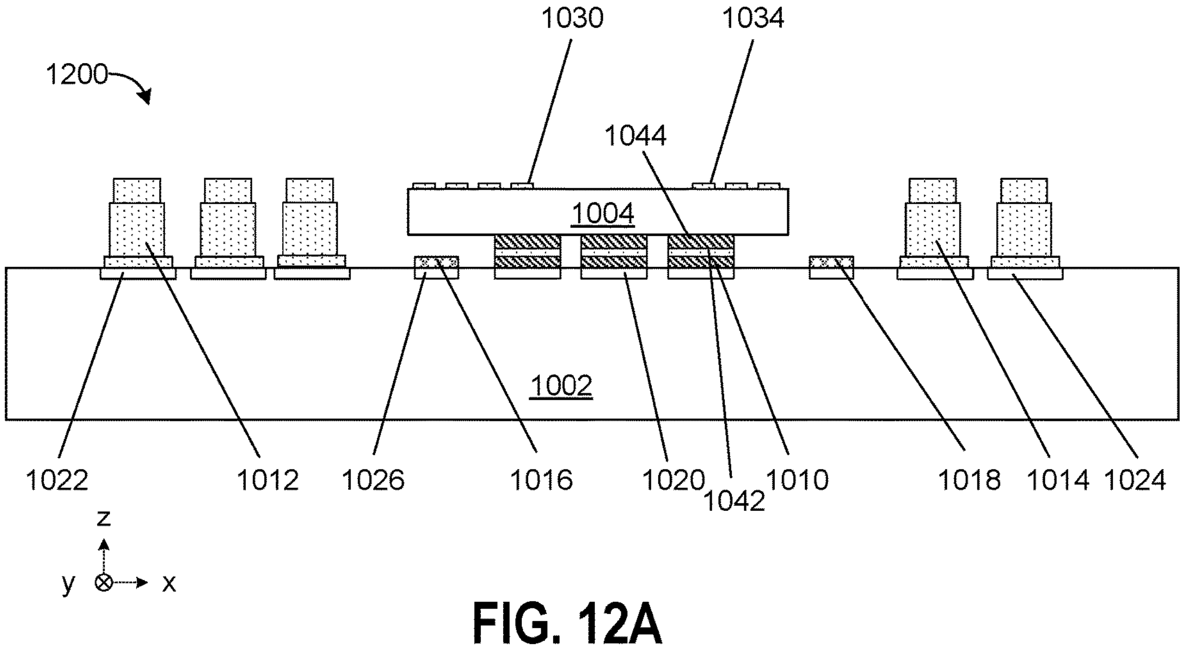
Figure 12B:
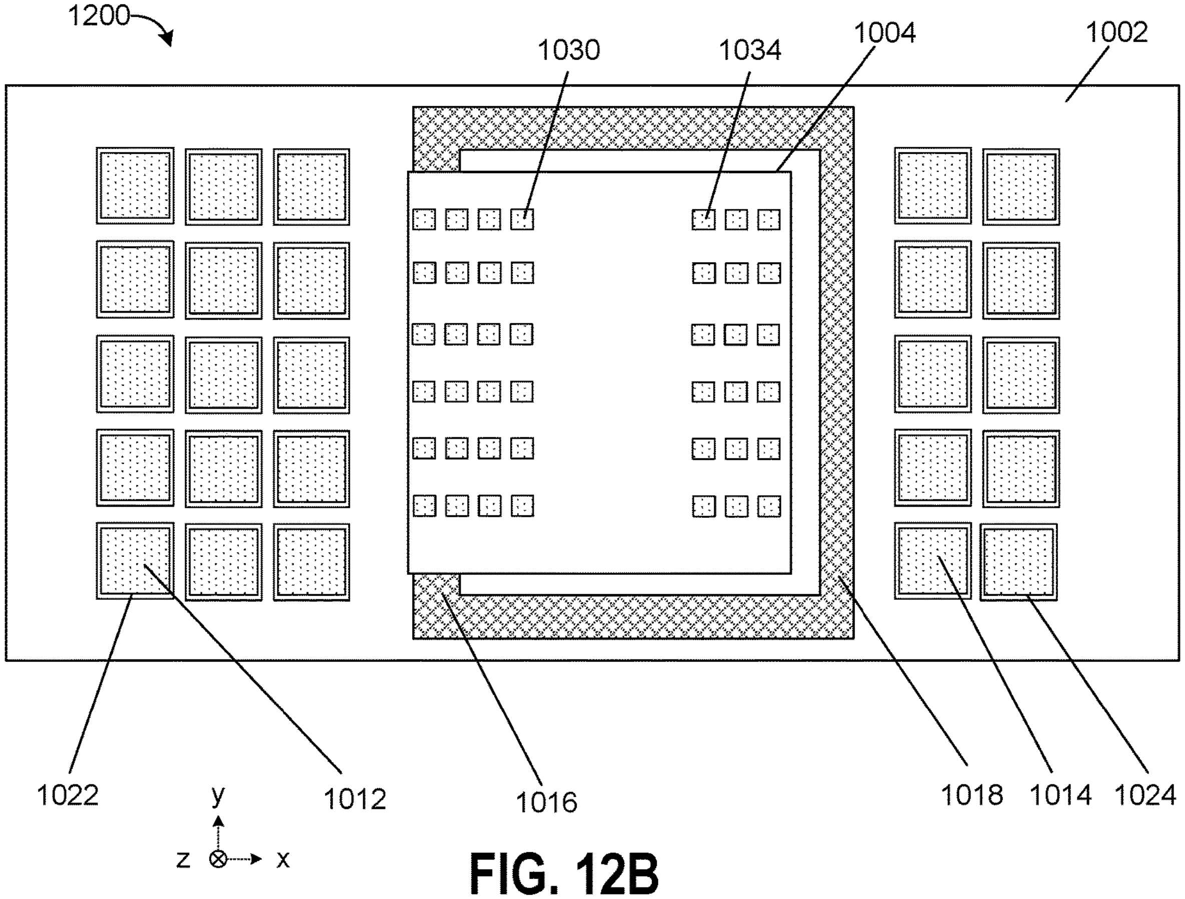

FIG. 12A is a cross-sectional view and FIG. 12B is a plan view of an assembly 1200 according to various embodiments. The assembly 1200 includes a first IC die 1004 that may be attached to assembly 1100. IC device package substrate 1002 includes a plurality of first interconnect features 1010. First IC die 1004 may include interconnect features 1044. As shown in FIG. 12A, solder 1042 has been reflowed to connect first interconnect features 1010 to interconnect features 1044 of the first IC die 1004. First IC die 1004 may include a plurality of interconnect features 1030 to couple to another IC die and a plurality of interconnect features 1034 to couple to another IC die.

Figure 13A:
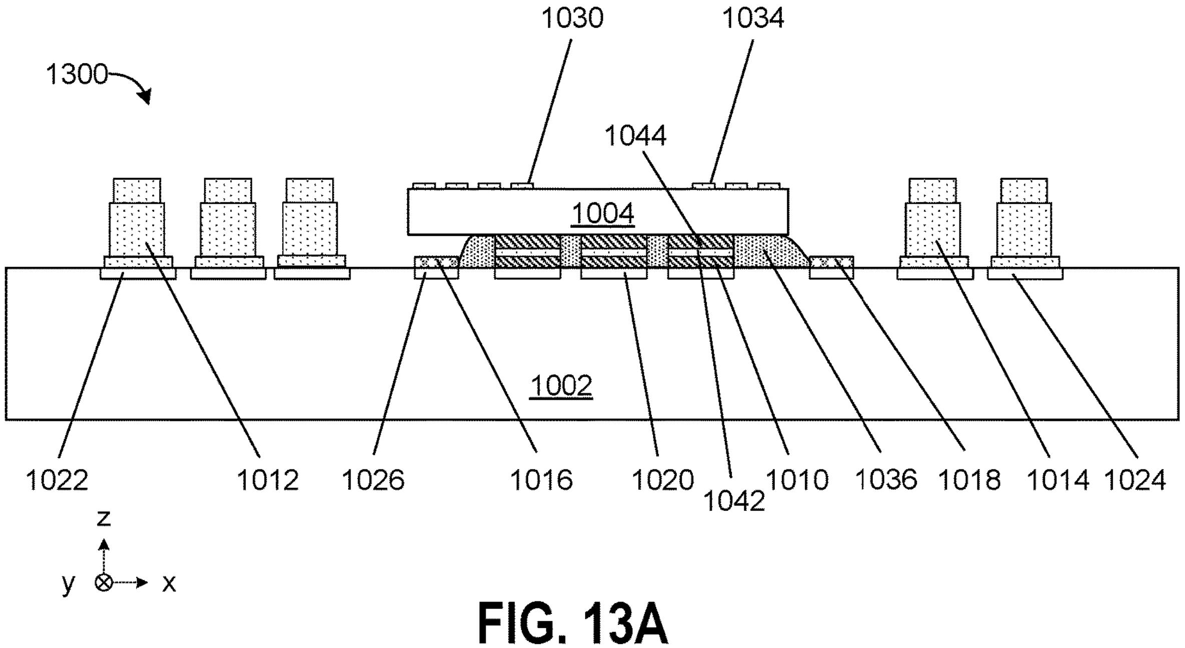
Figure 13B:
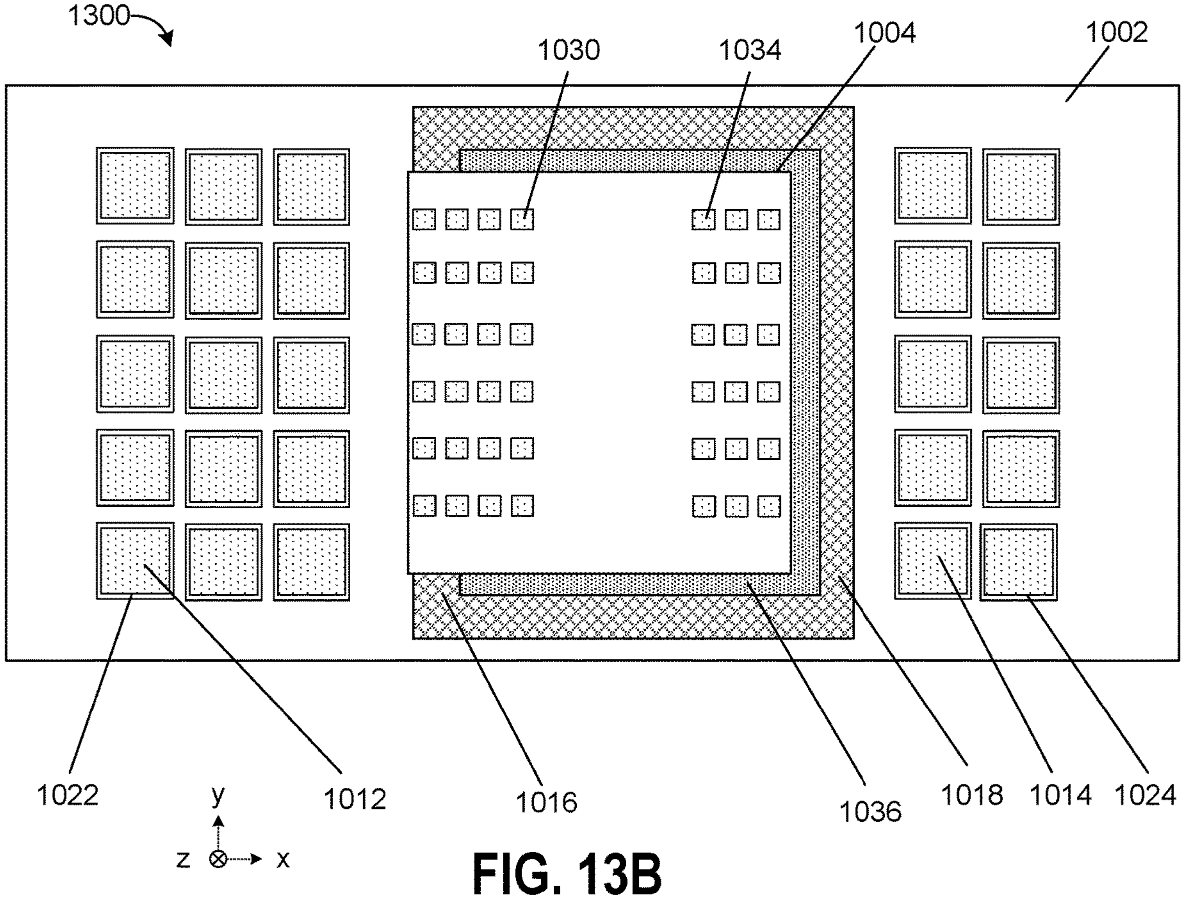

FIG. 13A is a cross-sectional view and FIG. 13B is a plan view of an assembly 1300 according to various embodiments. The assembly 1300 includes an underfill material 1036 that may be added to assembly 1200. Underfill material 1036 may be any suitable electrically-insulating adhesive that fills substantial portions of the gap between IC device 1004 and substrate 1002, which provides a mechanical connection and redistributes stresses that may result from a mismatch in thermal expansion coefficients of IC device 1004 and substrate 1002. Underfill material 1036 may be a pre-applied underfill paste in a TC-NCF process or a liquid underfill dispensed after die bonding in a TC-CUF process. Underfill material 1036 may be an organic material, such as an epoxy, and may include fillers, such as a nanofiller material a dielectric material. Underfill material 1036 is in contact with a first sidewall of at least one of the first interconnect features 1010. In embodiments, underfill material 1036 is in contact with a first sidewall of at least one of the barrier features proximal to the first interconnect features 1010, such as barrier features 1016 and 1018.

Figure 14A:
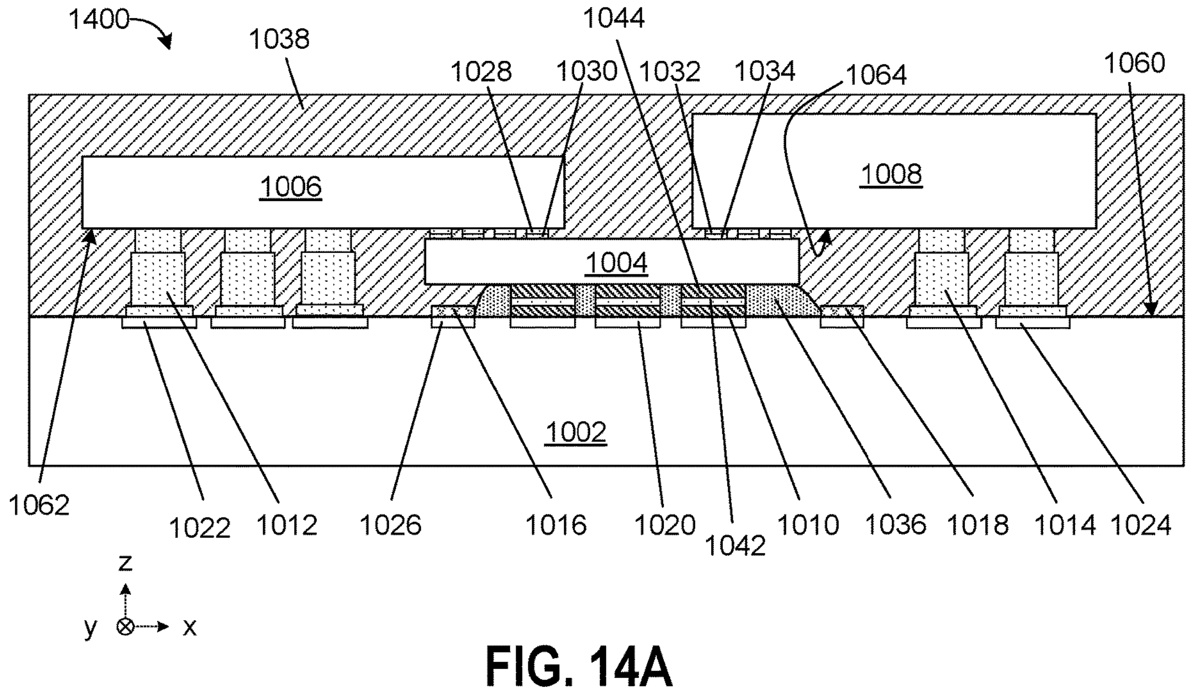
Figure 14B:
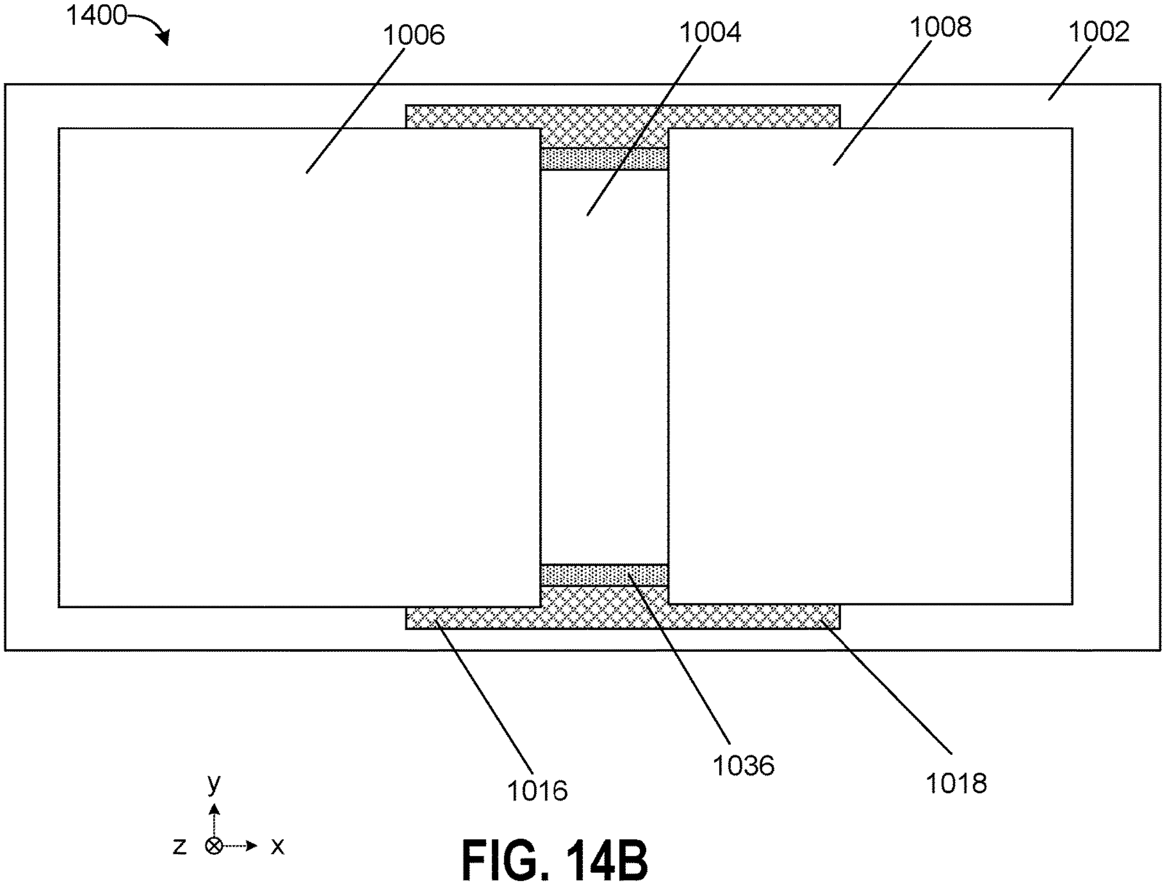

FIG. 14A is a cross-sectional view and FIG. 14B is a plan view of an assembly 1400 according to various embodiments. The assembly 1400 includes second IC die 1006 and third IC die 1008 that may be attached to assembly 1300, as well as a mold material 1038 that may be provided in the gaps between the two IC dies and the IC device package substrate 1002. In some embodiments, the mold material 1040 is over a barrier feature and is in contact with the underfill material 1036, e.g., mold material 1038 is over barrier feature 1018 and in contact with a fillet portion of underfill 1036. As shown in FIGS. 14A and 14B, the second IC die 1006 has been attached to package substrate 1002 via the plurality of second interconnect features 1012. The second IC die 1006 includes interconnect features 1028 and has been attached to the first IC die 1004 via interconnect features 1030 and interconnect features 1028. As may also be seen in the figures, the third IC die 1008 has been attached to package substrate 1002 via the plurality of third interconnect features 1014. The third IC die 1008 includes interconnect features 1032 and has been attached to the first IC die 1004 via interconnect features 1032 and interconnect features 1034. The second and third interconnect features 1012, 1014 may have a height which is greater than the height of first interconnect features 1010 (or total height of the sum of first interconnect features 1010, interconnect features 1044, and solder 1042), or a height that is greater than the distance from a surface 1060 of package substrate 1002 facing first IC die 1004 to a surface 1062, 1064 of one of the second IC die 1006 or third IC die 1008 facing the package substrate 1002.

Figure 15:
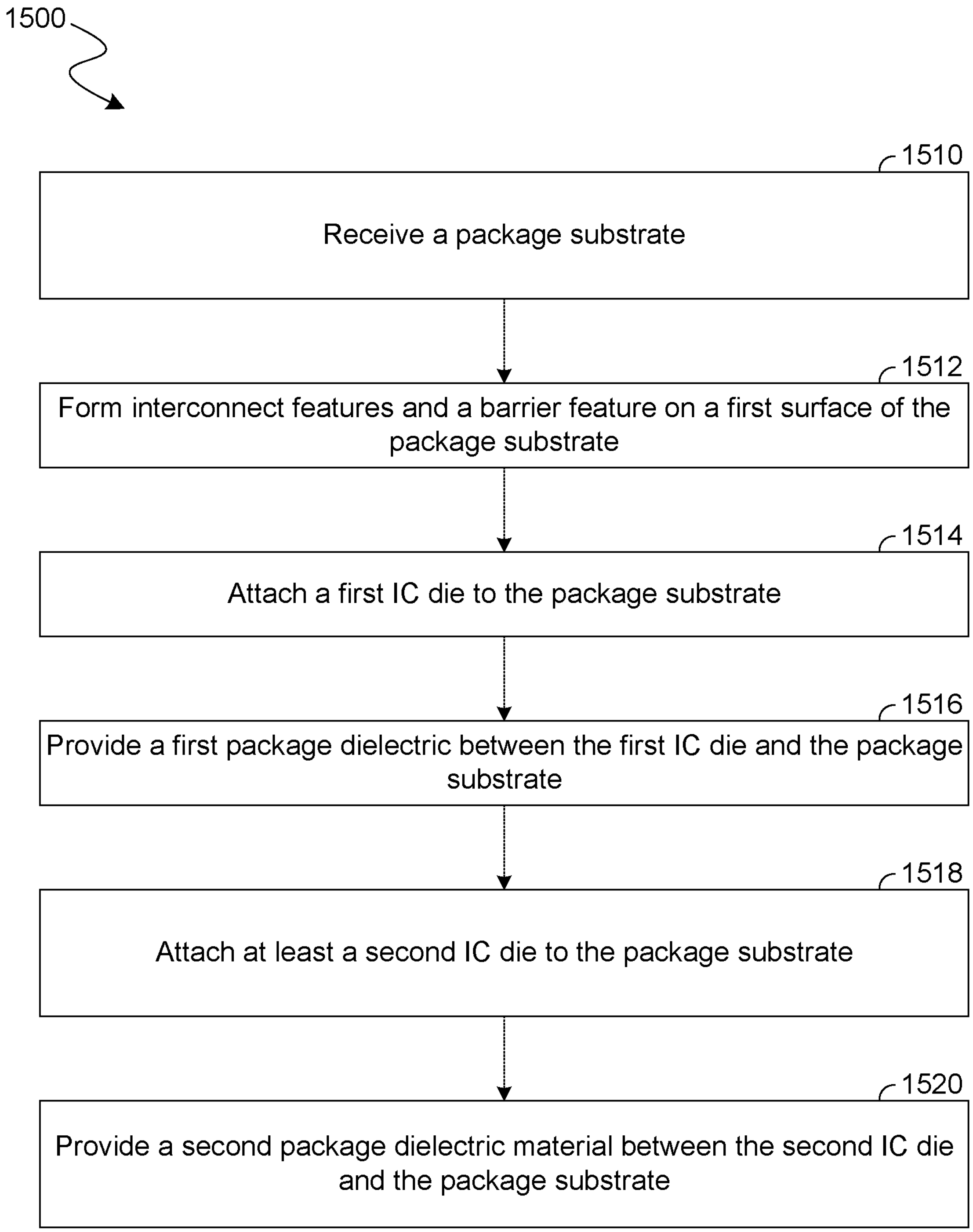
FIG. 15 illustrates a flowchart of a method of forming a composite IC device having a barrier feature on an IC device package substrate in accordance with some embodiments.

FIG. 15 illustrates a flowchart of a method 1500 of forming a composite IC device having a barrier feature on an IC device package substrate in accordance with some embodiments. Although the blocks in the flowchart with reference to FIG. 15 are shown in a particular order, the order of the actions can be modified. Thus, the illustrated embodiments can be performed in a different order, and some actions/blocks may be performed in parallel. Some of the blocks and/or operations listed in FIG. 15 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 1500 begins with operation 1510, receiving a, IC device package substrate. The IC device package substrate may be according to any of the embodiments described herein. IC device package substrate may include any number of device layers, dielectric layers, and metallization layers in some embodiments, but it is not required. The package substrate may comprise any suitable material or materials, including silicon, glass, or polymers. Interconnect features may be formed at operation 1512. In particular, a plurality of first interconnect features to couple to a first IC die, a plurality of second interconnect features to couple to a second IC die, and a plurality of third interconnect features to couple to a third IC die may be formed on the IC device package substrate using in conventional process, such as plating or deposition. In addition, at operation 1512, one or more barrier features the surface of the substrate 902 at any of the locations described herein. The one or more barrier features may comprise a metal, a polymer, or a glass, and may include two or more barrier segments according to any of the embodiments described herein.

A first IC die is attached to the package substrate at operation 1514. The first IC die may be according to any of the embodiments described herein. For example, the first IC die may include any number of device layers, dielectric layers, and metallization layers and may be capable of performing any desired function or functions. The first IC die may be attached to the package substrate via the first interconnect features on the package substrate, which may be a copper bump and which may include a solder cap, and interconnect features on a surface or in a layer of first IC die.

In operation 1516, a first package dielectric material is provided between the first IC die and the package substrate. The first package dielectric material may be an underfill material pre-applied underfill paste in a TC-NCF process or a liquid underfill dispensed after die bonding in a TC-CUF process. The first package dielectric material may be any suitable an organic material or organic plastic material, such as an epoxy material. The first package dielectric material may have a relatively low electrical conductivity, and may advantageously being a dielectric. Any alternative material known to be suitable for IC chip packaging applications may be used as the first package dielectric material. The first package dielectric material may also comprise a variety of fillers. The first package dielectric material may be provided so as to be adjacent to a sidewall of at least one of the first interconnect features and in contact with a first sidewall of at least one of the barrier features proximal to the first interconnect features.

A second IC die is attached or coupled to the package substrate in operation 1518. The second IC die may include any number of device layers, dielectric layers, and metallization layers, and may be capable of performing any desired function or functions, e.g., wireless radio, processor, memory, input/output, programmable logic, or power management functions. One or more IC die in addition to the second IC die may optionally be coupled or attached in operation 1518.

In operation 1520, a second package dielectric material may be provided between the second IC die and the IC device package substrate. The second package dielectric material may be any suitable an organic material or organic plastic material, such as an epoxy material. Any material known to be suitable for IC chip packaging applications may be used as mold material. The second package dielectric material may have a different composition than the first package dielectric material. The second package dielectric material may be provided so as to be adjacent to a sidewall of at least one of the plurality of second interconnect features on the IC device package substrate and in contact with a second sidewall of the barrier features proximal to the second interconnect features. In some embodiments, the second package dielectric material is over the barrier features and is in contact with the first dielectric material.

Figure 16:
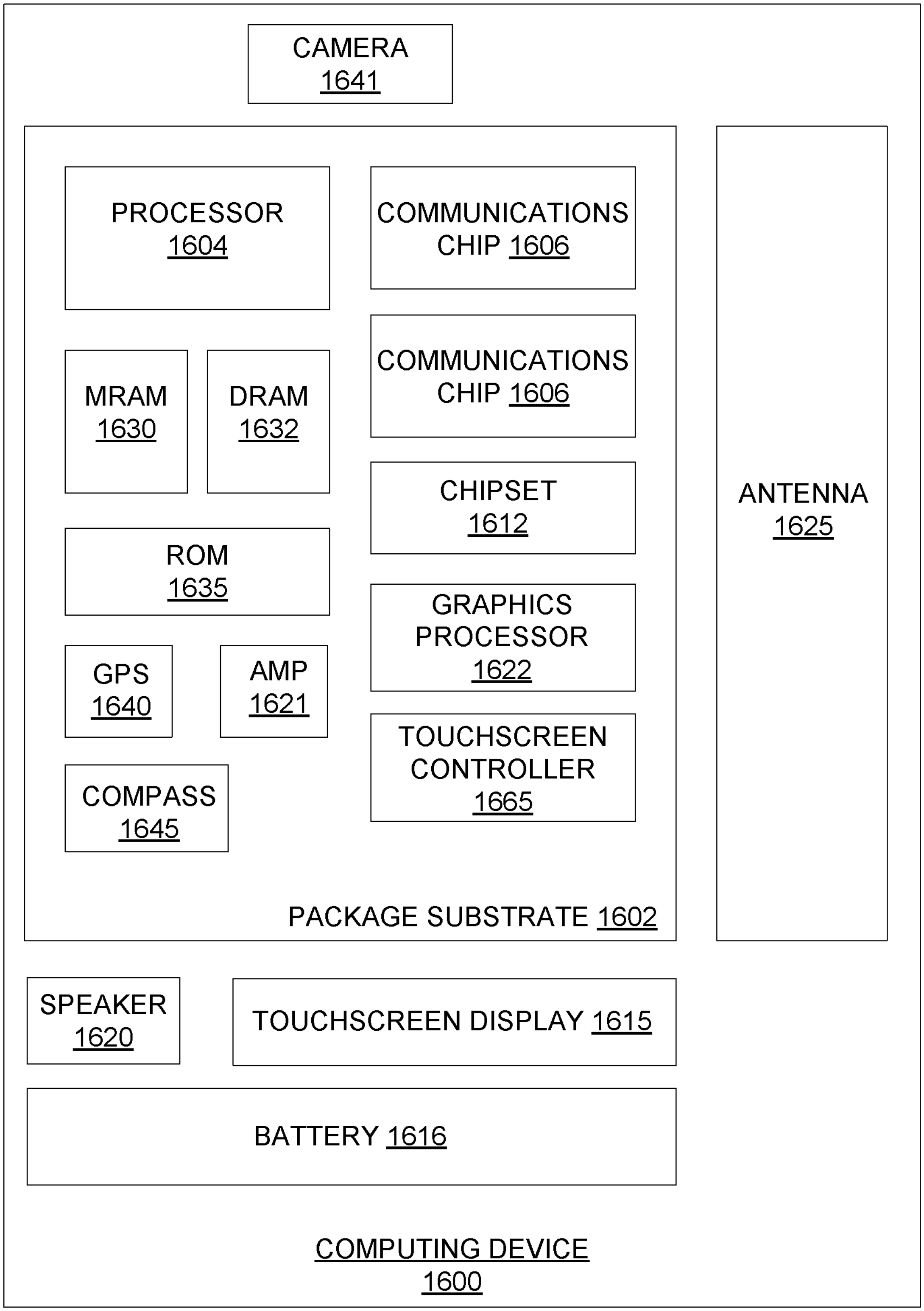
FIG. 16 is a functional block diagram of an electronic computing device in accordance with various embodiments.

FIG. 16 is a functional block diagram of an electronic computing device 1600, in accordance with an embodiment. Device 1600 further includes a package substrate 1602 hosting a number of components, such as, but not limited to, a processor 1604 (e.g., an applications processor). The package substrate 1602 includes one or more barrier features on a surface of the substrate. Processor 1604 may be physically and/or electrically coupled to package substrate 1602. In some examples, processor 1604 is within a composite IC chip structure including a chiplet bonded to a host IC chip, for example as described elsewhere herein. Processor 1604 may be implemented with circuitry in either or both of the host IC chip and chiplet. In general, the term "processor" or "microprocessor" may refer to any device or portion of a device that processes electronic data from registers and/or memory to transform that electronic data into other electronic data that may be further stored in registers and/or memory.

In various examples, one or more communication chips 1606 may also be physically and/or electrically coupled to the package substrate 1602. In further implementations, communication chips 1606 may be part of processor 1604. Depending on its applications, computing device 1600 may include other components that may or may not be physically and electrically coupled to package substrate 1602. These other components include, but are not limited to, volatile memory (e.g., DRAM 1632), non-volatile memory (e.g., ROM 1635), flash memory (e.g., NAND or NOR), magnetic memory (MRAM 1630), a graphics processor 1622, a digital signal processor, a crypto processor, a chipset 1612, an antenna 1625, touchscreen display 1615, touchscreen controller 1665, battery 1616, audio codec, video codec, power amplifier 1621, global positioning system (GPS) device 1640, compass 1645, accelerometer, gyroscope, speaker 1620, camera 1641, and mass storage device (such as hard disk drive, solid-state drive (SSD), compact disk (CD), digital versatile disk (DVD), and so forth), or the like. In some exemplary embodiments, at two of the functional blocks noted above are within a composite IC chip structure including a chiplet bonded to a host IC chip, for example as described elsewhere herein. For example, processor 1604 be implemented with circuitry in a first of the host IC chip and chiplet, and an electronic memory (e.g., MRAM 1630 or DRAM 1632) may be implemented with circuitry in a second of the host IC chip and chiplet.

Communication chips 1606 may enable wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1606 may implement any of a number of wireless standards or protocols. As discussed, computing device 1600 may include a plurality of communication chips 1606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Figure 17:
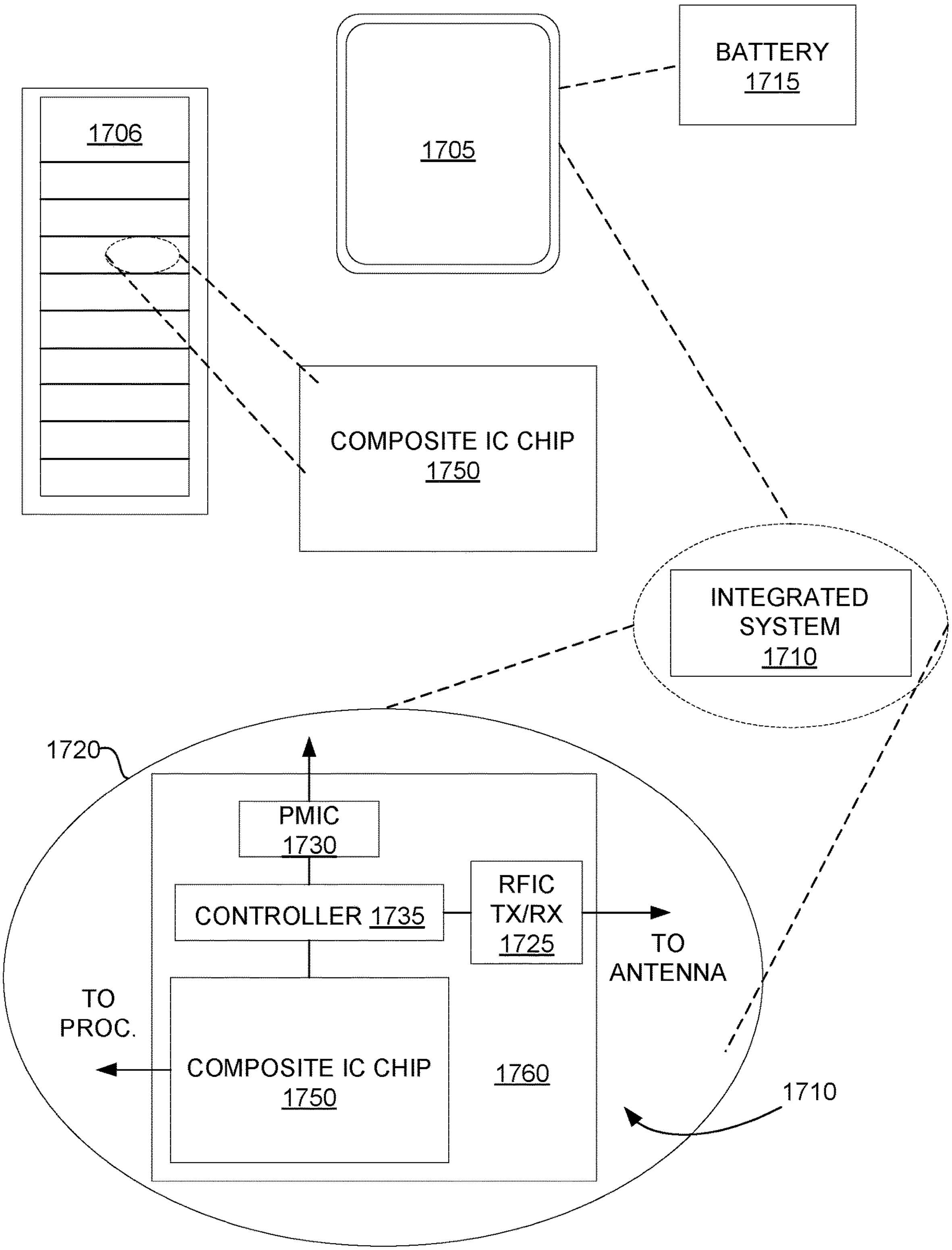
FIG. 17 illustrates a mobile computing platform and a data server machine employing an IC device comprising an IC die and a host component comprising a host substrate having one or more barrier features on a surface of the host substrate in accordance with various embodiments.

FIG. 17 illustrates a mobile computing platform and a data server machine employing an IC device comprising an IC die and a host component comprising a host substrate 1760 having one or more barrier features on the surface of the host substrate 1760, for example as described elsewhere herein. Computing device 1700 may be found inside platform 1705 or server machine 1706, for example. The server machine 1706 may be any commercial server, for example including any number of high-performance computing platforms disposed within a rack and networked together for electronic data processing, which in the exemplary embodiment includes a composite IC chip 1750 that includes a chiplet bonded to a host IC chip, for example as described elsewhere herein. The mobile computing platform 1705 may be any portable device configured for each of electronic data display, electronic data processing, wireless electronic data transmission, or the like. For example, the mobile computing platform 1705 may be any of a tablet, a smart phone, laptop computer, etc., and may include a display screen (e.g., a capacitive, inductive, resistive, or optical touchscreen), a chip-level or package-level integrated system 1710, and a battery 1715.

Whether disposed within the integrated system 1710 illustrated in the expanded view 1720, or as a stand-alone package within the server machine 1706, composite IC chip 1750 may include a chiplet bonded to a host IC chip, for example as described elsewhere herein. Composite IC chip 1750 may be further coupled to a host substrate 1760, along with, one or more of a power management integrated circuit (PMIC) 1730, RF (wireless) integrated circuit (RFIC) 1725 including a wideband RF (wireless) transmitter and/or receiver (TX/RX) (e.g., including a digital baseband and an analog front end module further comprises a power amplifier on a transmit path and a low noise amplifier on a receive path), and a controller 1735. PMIC 1730 may perform battery power regulation, DC-to-DC conversion, etc., and so has an input coupled to battery 1715 and with an output providing a current supply to other functional modules. As further illustrated, in the exemplary embodiment, RFIC 1725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

Example 1: An integrated circuit (IC) device package substrate, comprising: a plurality of first interconnect features to couple to a first IC die, wherein the first interconnect features span a first length in a first direction on a surface of the substrate; a plurality of second interconnect features to couple to a second IC die, wherein the second interconnect features span a second length in the first direction on the surface of the substrate, wherein the second interconnect features are between the first length of the first interconnect features and a first edge of the substrate; and one or more barrier features on the surface of the substrate and between the first and second interconnect features, wherein the one or more barrier features span a third length in the first direction, the third length is greater than at least one of the first or second lengths, and the one or more barrier features have a first height that is less than a second height of the second interconnect features.

Example 2: The IC device package substrate of example 1, wherein the one or more barrier features comprises two or more barrier segments, a first of the barrier segments extending in the first direction and a second of the barrier segments extending in a second direction, substantially orthogonal to the first direction.

Example 3: The IC device package substrate of example 1, wherein the one or more barrier features encircle the plurality of first interconnect features, and wherein the plurality of second interconnect features are outside of a region of the surface encircled by the one or more barrier features.

Example 4: The IC device package substrate of any of examples 1 to 3, wherein the one or more of first interconnect features are spaced apart from the one or more barrier features by a first distance, and the plurality of second interconnect features are spaced apart from the one or more barrier features by a second distance, different than the first distance.

Example 5: The IC device package substrate of example 4, wherein the first distance is greater than the second distance.

Example 6: The IC device package substrate of any of examples 1 to 5, wherein the one or more barrier features comprise a plurality of colinear discrete features longitudinally spaced apart along the third length.

Example 7: The IC device package substrate of any of examples 1 to 6, wherein the one or more barrier features have a first height substantially equal to a second height of the plurality of first interconnect features.

Example 8: The IC device package substrate of any of examples 1 to 7, wherein the one or more barrier features comprises a metal.

Example 9: The IC device package substrate of any of examples 1 to 8, wherein the one or more barrier features have substantially the same composition as at least one of the first or second interconnect features.

Example 10: The IC device package substrate of any of examples 1 to 7, wherein the one or more barrier features comprises a polymer or a glass.

Example 11: An IC device, comprising: a first IC die coupled with a plurality of first interconnect features of a package substrate that span a first length in a first direction on a surface of the substrate; a second IC die coupled with a plurality of second interconnect features of the package substrate that span a second length on the surface of the substrate, wherein the second interconnect features are between the first length of the first interconnect features and a first edge of the package substrate, wherein the package substrate comprises one or more barrier features on the surface and between the first and second interconnect features, the one or more barrier features spanning a third length in the first direction, the third length greater than at least one of the first or second lengths; and a package dielectric material adjacent to a sidewall of at least one of the first interconnect features and in contact with a first sidewall of at least one of the barrier features proximal to the first interconnect features.

Example 12: The IC device of example 11, wherein the one or more barrier features are between the surface of the substrate and a surface of the first IC die.

Example 13: The IC device of example 11 or example 12, wherein a portion of second IC die is over at least a portion of the first IC die and the second interconnect features have a height greater than a height of the first interconnect features and a thickness of the first IC die.

Example 14: The IC device of any of examples 11 to 13, further comprising a second package dielectric material adjacent to a sidewall of at least one of the plurality of second interconnect features and in contact with a second sidewall of the one or more barrier features proximal to the second interconnect features.

Example 15: The IC device of example 14, wherein at least one of the first or second package dielectric materials comprises an epoxy.

Example 16: The IC device of example 14, wherein the second package dielectric material is over the one or more barrier features and is in contact with the first dielectric material.

Example 17: A system comprising: a power supply coupled with a system board; an integrated circuit (IC) device package substrate coupled with the system board and to receive power from the power supply, the IC device package substrate comprising: a plurality of first interconnect features to couple to a first IC die, wherein the first interconnect features span a first length in a first direction on a surface of the substrate; a plurality of second interconnect features to couple to a second IC die, wherein the second interconnect features span a second length in the first direction on the surface of the substrate, wherein the second interconnect features are between the first length of the first interconnect features and a first edge of the substrate; and one or more barrier structures on the surface of the substrate and between the first and second interconnect features, wherein the one or more barrier features span a third length in the first direction, the third length is greater than at least one of the first or second lengths, and the one or more barrier structures have a first height that is less than a second height of the second interconnect features.

Example 18: The system of example 17, further comprising: the first IC die, wherein the first IC die comprises a device layer having at least one transistor; the second IC die, wherein the second IC die is over the first IC die; and a package dielectric material adjacent to a sidewall of at least one of the first interconnect features and in contact with a first sidewall of at least one of the barrier structures proximal to the first interconnect features.

Example 19: The system of example 18, further comprising: a second package dielectric material adjacent to a sidewall of at least one of the plurality of second interconnect features and in contact with a second sidewall of the one or more barrier structures proximal to the second interconnect features.

Example 20: The system of example 19, wherein the second package dielectric material is over the one or more barrier structures and is in contact with the first IC device.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should therefore be determined with reference to the appended claims, along with the full scope of equivalents to which such claims are entitled.

What is claimed is:

1. An integrated circuit (IC) device package substrate, comprising:

a plurality of first interconnect features to couple to a first IC die, wherein the first interconnect features span a first length in a first direction on a surface of the substrate;

a plurality of second interconnect features to couple to a second IC die, wherein the second interconnect features span a second length in the first direction on the surface, wherein the second interconnect features are between the first length of the first interconnect features and a first edge of the substrate; and one or more barrier features on the surface between the first and second interconnect features, wherein the one or more barrier features span a third length in the first direction, the third length is greater than at least one of the first or second lengths, the one or more barrier features have a first height that is less than a second height of the second interconnect features, the first edge extends a fourth length in the first direction, and the third length is less than the fourth length.

2. The IC device package substrate of claim 1, wherein the one or more barrier features comprises two or more barrier segments, a first of the barrier segments extending the third length in the first direction and a second of the barrier segments extending in a second direction, substantially orthogonal to the first direction.

3. The IC device package substrate of claim 2, wherein the one or more barrier features encircle the plurality of first interconnect features, and wherein the plurality of second interconnect features are outside of a region of the surface encircled by the one or more barrier features.

4. The IC device package substrate of claim 1, wherein the plurality of first interconnect features comprise first ones nearest the barrier features, arranged in a first row in the first direction, and spaced apart from the one or more barrier features by a first distance, and the plurality of second interconnect features comprise second ones nearest the barrier features, arranged in a second row in the first direction, and spaced apart from the one or more barrier features by a second distance, different than the first distance.

5. The IC device package substrate of claim 4, wherein the first distance is greater than the second distance.

6. The IC device package substrate of claim 1, wherein the one or more barrier features comprise a plurality of colinear discrete features longitudinally spaced apart along the third length.

7. The IC device package substrate of claim 1, wherein the one or more barrier features have a first height substantially equal to a second height of the plurality of first interconnect features.

8. The IC device package substrate of claim 1, wherein the one or more barrier features comprises a metal.

9. The IC device package substrate of claim 8, wherein the one or more barrier features have substantially the same composition as at least one of the first or second interconnect features.

10. The IC device package substrate of claim 1, wherein the one or more barrier features comprises a polymer or a glass.

11. An IC device, comprising:

a first IC die coupled with a plurality of first interconnect features of a package substrate, wherein the first interconnect features are arranged in rows that span a first length in a first direction on a surface of the substrate;

a second IC die coupled with a plurality of second interconnect features of the package substrate, wherein the second interconnect features are arranged in rows that span a second length on the surface, wherein the second interconnect features are between the first length of the first interconnect features and a first edge of the package substrate, wherein the package substrate comprises one or more barrier features on the surface and between the first and second interconnect features, the one or more barrier features spanning a third length in the first direction, the third length greater than at least one of the first or second lengths;

a package dielectric material adjacent to a sidewall of at least one of the first interconnect features and in contact with a first sidewall of at least one of the barrier features proximal to the first interconnect features; and wherein first ones of the first interconnect features in a first row nearest the barrier features are spaced apart from the one or more barrier features by a first distance, second ones of the second interconnect features in a second row nearest the barrier features are spaced apart from the one or more barrier features by a second distance, and the second distance is greater than the first distance.

12. The IC device of claim 11, wherein the one or more barrier features are between the surface of the substrate and a surface of the first IC die.

13. The IC device of claim 11, wherein a portion of second IC die is over at least a portion of the first IC die and the second interconnect features have a height greater than a height of the first interconnect features and a thickness of the first IC die.

14. The IC device of claim 11, further comprising a second package dielectric material adjacent to a sidewall of at least one of the plurality of second interconnect features and in contact with a second sidewall of the one or more barrier features proximal to the second interconnect features.

15. The IC device of claim 14, wherein at least one of the first or second package dielectric materials comprises an epoxy.

16. The IC device of claim 14, wherein the second package dielectric material is over the one or more barrier features and is in contact with the first dielectric material.

17. A system comprising:

a power supply coupled with a system board; and an integrated circuit (IC) device package substrate coupled with the system board and to receive power from the power supply, the IC device package substrate comprising:

a plurality of first interconnect features to couple to a first IC die, wherein the first interconnect features span a first length in a first direction on a surface of the substrate;

a plurality of second interconnect features to couple to a second IC die, wherein the second interconnect features span a second length in the first direction on the surface, wherein the second interconnect features are between the first length of the first interconnect features and a first edge of the substrate; and one or more barrier structures on the surface between the first and second interconnect features, wherein the one or more barrier features span a third length in the first direction, the third length is greater than at least one of the first or second lengths, the one or more barrier structures have a first height that is less than a second height of the second interconnect features, the first edge extends a fourth length in the first direction, and the third length is less than the fourth length.

18. The system of claim 17, further comprising:

the first IC die, wherein the first IC die comprises a device layer having at least one transistor;

the second IC die, wherein the second IC die is over the first IC die; and a package dielectric material adjacent to a sidewall of at least one of the first interconnect features and in contact with a first sidewall of at least one of the barrier structures proximal to the first interconnect features.

19. The system of claim 18, further comprising:

a second package dielectric material adjacent to a sidewall of at least one of the plurality of second interconnect features and in contact with a second sidewall of the one or more barrier structures proximal to the second interconnect features.

20. The system of claim 19, wherein the second package dielectric material is over the one or more barrier structures and is in contact with the first IC device.

* * * * *